(12) United States Patent
Kim et al.

(10) Patent No.: US 9,613,687 B2
(45) Date of Patent: *Apr. 4, 2017

(54) MEMORY, MEMORY CONTROLLER, MEMORY SYSTEM, METHOD OF MEMORY, MEMORY CONTROLLER AND MEMORY SYSTEM

(71) Applicant: Samsung Electronics Co., Ltd., Suwon-si, Gyeonggi-do (KR)

(72) Inventors: Kyungryun Kim, Seoul (KR); Sangyong Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 45 days.

This patent is subject to a terminal disclaimer.

(21) Appl. No.: 14/147,063

(22) Filed: Jan. 3, 2014

(65) Prior Publication Data

US 2014/0223246 A1    Aug. 7, 2014

(30) Foreign Application Priority Data

Feb. 6, 2013  (KR) .................. 10-2013-0013497

(51) Int. Cl.
*G11C 11/56* (2006.01)
*G11C 16/34* (2006.01)
(Continued)

(52) U.S. Cl.
CPC ...... *G11C 11/5642* (2013.01); *G06F 11/1012* (2013.01); *G06F 11/1048* (2013.01);
(Continued)

(58) Field of Classification Search
CPC ........... G11C 16/3418; G11C 11/5642; G11C 16/0483; G11C 16/349; G11C 29/028;
(Continued)

(56) References Cited

U.S. PATENT DOCUMENTS 5,933,381 A    8/1999   Iwata
6,762,974 B1 *  7/2004  Johnson et al. ......... 365/233.11
(Continued)

FOREIGN PATENT DOCUMENTS

JP    H11-096755       4/1999
JP    2010-515202 A    5/2010
(Continued)

OTHER PUBLICATIONS

Notice of Allowance for corresponding U.S. Appl. No. 15/143,971 dated Jul. 8, 2016.

*Primary Examiner* — John J Tabone, Jr.
(74) *Attorney, Agent, or Firm* — Harness, Dickey & Pierce

(57) ABSTRACT

In one embodiment, the method includes performing a read operation on a memory, and determining, by a memory controller, whether to perform a reliability verification read operation based on a count value and a reference value. The count value is based on a number of read commands issued by the memory controller to the memory, and the reliability verification read operation is for reading data from at least one memory cell associated with at least one unselected word line in the memory. An unselected word line is a word line not selected during the read operation. The method further includes performing the reliability verification read operation for the at least one unselected word line based on the determining.

67 Claims, 36 Drawing Sheets

(51) Int. Cl.
    *G11C 16/04*         (2006.01)
    *G11C 29/02*         (2006.01)
    *G06F 11/10*         (2006.01)
    *H01L 27/11578*     (2017.01)
    *H03M 13/37*        (2006.01)

(52) U.S. Cl.
    CPC ........ *G11C 16/0483* (2013.01); *G11C 16/349* (2013.01); *G11C 16/3418* (2013.01); *G11C 16/3427* (2013.01); *G11C 29/028* (2013.01); *H01L 27/11578* (2013.01); *H03M 13/373* (2013.01); *G11C 2211/5644* (2013.01)

(58) Field of Classification Search
    CPC ........ G11C 16/3427; G11C 2211/5644; H01L 27/11578; G06F 11/1012; G06F 11/1048; H03M 13/373
    USPC ............... 714/718, 768; 365/185.11, 185.17, 365/185.24, 222, 185.05, 185.33, 230.01, 365/233.17, 236; 711/E12.008, 103, 105, 711/166, 167
    See application file for complete search history.

(56) References Cited

U.S. PATENT DOCUMENTS

| | | | |
|---|---|---|---|
| 7,012,835 B2 | 3/2006 | Gonzalez et al. | |
| 7,440,324 B2 | 10/2008 | Mokhlesi | |
| 7,477,547 B2 | 1/2009 | Lin | |
| 7,679,133 B2 | 3/2010 | Son et al. | |
| 7,808,831 B2 * | 10/2010 | Mokhlesi | G11C 11/5642 365/185.02 |
| 7,876,620 B2 | 1/2011 | Mokhlesi et al. | |
| 7,990,764 B2 | 8/2011 | Alrod et al. | |
| 8,130,544 B2 | 3/2012 | Chou et al. | |
| 8,174,881 B2 | 5/2012 | Kwon et al. | |
| 8,264,880 B1 | 9/2012 | Yang | |
| 8,316,278 B2 | 11/2012 | Ahn et al. | |
| 8,339,881 B2 | 12/2012 | Danilak | |
| 8,553,466 B2 | 10/2013 | Han et al. | |
| 8,559,224 B2 | 10/2013 | Han et al. | |
| 8,559,235 B2 | 10/2013 | Yoon et al. | |
| 8,654,587 B2 | 2/2014 | Yoon et al. | |
| 8,665,647 B2 * | 3/2014 | Lee et al. | 365/185.18 |
| 8,670,272 B2 | 3/2014 | Radke | |
| 8,908,430 B2 * | 12/2014 | Yoo | G11C 16/06 365/185.03 |
| 8,923,053 B2 * | 12/2014 | Han et al. | 365/185.11 |
| 2005/0141283 A1 * | 6/2005 | Lee | G11C 16/0483 365/185.28 |
| 2005/0162913 A1 | 7/2005 | Chen | |
| 2005/0213385 A1 | 9/2005 | Hosono et al. | |
| 2006/0092703 A1 | 5/2006 | Chae et al. | |
| 2007/0171722 A1 | 7/2007 | Kang et al. | |
| 2008/0101122 A1 | 5/2008 | Kang et al. | |
| 2008/0144378 A1 | 6/2008 | Park et al. | |
| 2008/0279012 A1 | 11/2008 | Lee | |
| 2008/0316822 A1 | 12/2008 | Ahn et al. | |
| 2009/0129157 A1 | 5/2009 | Honda et al. | |
| 2009/0323412 A1 | 12/2009 | Mokhlesi et al. | |
| 2010/0011156 A1 | 1/2010 | Yim et al. | |
| 2010/0232227 A1 * | 9/2010 | Lee | G11C 16/3454 365/185.19 |
| 2010/0235713 A1 * | 9/2010 | Lee | G06F 11/1072 714/763 |
| 2011/0019486 A1 | 1/2011 | Jang et al. | |
| 2011/0075484 A1 | 3/2011 | Lee et al. | |
| 2011/0119431 A1 * | 5/2011 | Chowdhury | 711/103 |
| 2011/0194346 A1 | 8/2011 | Yoon et al. | |
| 2011/0199825 A1 * | 8/2011 | Han et al. | 365/185.11 |
| 2011/0233648 A1 | 9/2011 | Seol et al. | |
| 2011/0292726 A1 | 12/2011 | Lee et al. | |
| 2011/0305081 A1 | 12/2011 | Lee | |
| 2012/0170378 A1 * | 7/2012 | Aritome et al. | 365/185.24 |
| 2012/0275234 A1 | 11/2012 | Lee et al. | |
| 2013/0007353 A1 * | 1/2013 | Shim et al. | 711/103 |
| 2013/0033929 A1 * | 2/2013 | Kim | G11C 13/0004 365/163 |
| 2013/0155776 A1 | 6/2013 | Chilappagari et al. | |
| 2014/0129904 A1 * | 5/2014 | Sakai et al. | 714/768 |
| 2014/0181392 A1 * | 6/2014 | Malladi et al. | 711/105 |
| 2014/0181452 A1 * | 6/2014 | Malladi et al. | 711/166 |
| 2014/0223246 A1 | 8/2014 | Kim et al. | |
| 2015/0162066 A1 * | 6/2015 | Song et al. | 365/222 |
| 2015/0162071 A1 * | 6/2015 | Yoon et al. | 365/222 |
| 2016/0093394 A1 * | 3/2016 | Lee | G11C 16/26 365/185.12 |

FOREIGN PATENT DOCUMENTS

| | | |
|---|---|---|
| KR | 10-0686274 B1 | 2/2007 |
| KR | 10-0841336 B1 | 6/2008 |
| KR | 10-0874911 B1 | 12/2008 |
| KR | 10-0882841 B1 | 2/2009 |
| KR | 10-0899193 B1 | 5/2009 |
| KR | 2009-0129624 A | 12/2009 |
| KR | 2010-0006715 A | 1/2010 |
| KR | 2011-0034068 A | 4/2011 |
| KR | 2011-0038083 A | 4/2011 |
| KR | 2011-0132072 A | 12/2011 |

* cited by examiner

Fig. 4

| WL | Read Sequence | % of strong disturb |
|---|---|---|
| WL6 | none | k |
| WL5 | 1, 2, 3, 4,•••, k | none |
| WL4 | none | k |
| WL3 | none | none |
| WL2 | none | none |

Fig. 5

| WL | Read Sequence | % of strong disturb |
|---|---|---|
| WL6 | none | k |
| WL5 | 1, 3, 5,•••, 2k-1 | none |
| WL4 | none | 2k |
| WL3 | 2, 4, 6,•••, 2k | none |
| WL2 | none | k |

Fig. 12

Total Management

| RDN | Read Count |
|---|---|

Block Group Management

| BLK Group 1 | RDN 1 | Read Count 1 |
|---|---|---|
| BLK Group 2 | RDN 2 | Read Count 2 |
| ⋮ | ⋮ | ⋮ |
| BLK Group n | RDN n | Read Count n |

Block Management

| BLK 1 | RDN 1 | Read Count 1 |
|---|---|---|
| BLK 2 | RDN 2 | Read Count 2 |
| ⋮ | ⋮ | ⋮ |
| BLK Group n | RDN n | Read Count n |

Fig. 15

Total Management

| First reliability verification read table (Adjacent WL read) | | Second reliability verification read table (Open WL read) | |
|---|---|---|---|
| RDN_C | Read Count C | RDN_O | Read Count O |

Block Group Management

| First reliability verification read table (Adjacent WL read) | | | Second reliability verification read table (Open WL read) | | |
|---|---|---|---|---|---|
| BLK Group C1 | RDN_C1 | Read Count C1 | BLK Group O1 | RDN_O1 | Read Count O1 |
| BLK Group C2 | RDN_C2 | Read Count C2 | BLK Group O2 | RDN_O2 | Read Count O2 |
| ⋮ | | | ⋮ | | |
| BLK Group Cn | RDN_Cn | Read Count Cn | BLK Group On | RDN_On | Read Count On |

Block Management

| First reliability verification read table (Adjacent WL read) | | | Second reliability verification read table (Open WL read) | | |
|---|---|---|---|---|---|
| BLK_C1 | RDN_C1 | Read Count C1 | BLK_C1 | RDN_C1 | Read Count C1 |
| BLK_C2 | RDN_C2 | Read Count C2 | BLK_C2 | RDN_C2 | Read Count C2 |
| ⋮ | | | ⋮ | | |
| BLK_Cn | RDN_Cn | Read Count Cn | BLK_Cn | RDN_Cn | Read Count Cn |

Fig. 18A

| | Reliability verification read of lower WL | Reliability verification read of higher WL | Post Operation |
|---|---|---|---|
| Case 1 Higher WL is closed WL | Pass | Pass | none |
| | Pass | Fail | Read Reclaim |
| | Fail | none | Read Reclaim |
| Case 2 Higher WL is open WL | Pass | Pass | none |
| | Pass | Fail | Close BLK |
| | Fail | none | Read Reclaim |

Fig. 18B

| | Reliability verification read of lower WL | Reliability verification read of higher WL | Post Operation |
|---|---|---|---|
| Case 1 Higher WL is closed WL | Pass | Pass | none |
| | Pass | Fail | Read Reclaim |
| | Fail | Pass | Read Reclaim |
| | Fail | Fail | Read Reclaim X2 |
| Case 2 Higher WL is open WL | Pass | Pass | none |
| | Pass | Fail | Close BLK |
| | Fail | Pass | Read Reclaim |
| | Fail | Fail | Read Reclaim & Close BLK | ns
MEMORY, MEMORY CONTROLLER, MEMORY SYSTEM, METHOD OF MEMORY, MEMORY CONTROLLER AND MEMORY SYSTEM

CROSS-REFERENCE TO RELATED APPLICATIONS

A claim for priority under 35 U.S.C. §119 is made to Korean Patent Application No. 10-2013-0013497 filed Feb. 6, 2013, in the Korean Intellectual Property Office, the entire contents of which are hereby incorporated by reference.

BACKGROUND

The inventive concepts described herein relate to a semiconductor device, and more particularly, relate to a memory controller, a memory system, and an operating method of the memory system.

A semiconductor memory device is a memory device which is fabricated using semiconductors such as silicon (Si), germanium (Ge), gallium arsenide (GaAs), indium phosphide (InP), and so on. Semiconductor memory devices are classified into volatile memory devices and nonvolatile memory devices.

Volatile memory devices may lose stored contents at power-off. Volatile memory devices include a static RAM (SRAM), a dynamic RAM (DRAM), a synchronous DRAM (SDRAM), and the like. Nonvolatile memory devices may retain stored contents even at power-off. Nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on.

A memory may be used with a memory controller for controlling the memory. The memory controller may act as an interface between a host and the memory. Also, the memory controller may perform operations, not directed by the host, to manage the memory. The operations not directed by the host may be referred to as background operations.

SUMMARY

At least one embodiment relates to a method of operating a memory controller.

In one embodiment, the method includes performing a read operation on a memory, and determining, by a memory controller, whether to perform a reliability verification read operation based on a count value and a reference value. The count value is based on a number of read commands issued by the memory controller to the memory, and the reliability verification read operation is for reading data from at least one memory cell associated with at least one unselected word line in the memory. An unselected word line is a word line not selected during the read operation. The method further includes performing the reliability verification read operation for the at least one unselected word line based on the determining.

In one embodiment, the method further includes generating a random number as the reference value. For example, the generating may generate the random number such that an average of random numbers generated over time approaches a desired value. In one embodiment, the method includes adjusting the desired value based on erase cycle information for the memory.

In one embodiment, the determining determines to perform the reliability verification read operation if the count value is greater than or equal to the random number.

In one embodiment, the method further includes resetting the count value if the determining determines to perform the reliability verification read operation.

In one embodiment, the method further includes storing the count value and the random number in the memory if the memory controller is powered off.

In one embodiment, the count value is for an entire data area of the memory.

In one embodiment, the method further includes maintaining count values and random numbers for each of a plurality of groups of blocks in the memory. Here, the determining uses the count value and the random number associated with the group of blocks to which the read operation is directed. In one embodiment, the performing performs the reliability verification read operation for the unselected word line in the group of blocks to which the read operation is directed.

In one embodiment, the method further includes maintaining count values and random numbers for each of a plurality of blocks in the memory. Here, the determining uses the count value and the random number associated with the block to which the read operation is directed. In one embodiment, the performing performs the reliability verification read operation for the unselected word line in the block to which the read operation is directed.

In one embodiment, the performing performs the reliability verification read operation for at least one unselected word line adjacent to the selected word line. For example, the performing may perform the reliability verification read operation for a (k+1)th word line if the kth word line is the selected word line. As another example, the performing may perform the reliability verification read operation for a (k−1)th word line if the kth word line is the selected word line. As a further example, the performing may perform the reliability verification read operation for a (k−1)th word line and a (k+1)th word line if the kth word line is the selected word line. In this example, the reliability verification read operation may include, after the kth word line is read, reading from the (k−1)th word line, and then reading from the (k+1)th word line. As an alternative, the reliability verification read operation may include, after the kth word line is read, reading from the (k+1)th word line, and then reading from the (k−1)th word line. As another alternative, the reliability verification read operation may include reading from the (k−1)th word line before the kth word line is read, and reading from the (k+1)th word line after the kth word line is read. As yet another alternative, the reliability verification read operation may include reading from the (k+1)th word line before the kth word line is read, and reading from the (k−1)th word line after the kth word line is read. In yet a further alternative, the reliability verification read operation may include reading from the (k−1)th word line after the kth word line is read, and reading from the (k−1)th word line after a next selected word lines is read. In another alternative, the reliability verification read operation may include reading from the (k+1)th word line after the kth word line is read, and reading from the (k−1)th word line after a next selected word lines is read.

In one embodiment, the performing performs the reliability verification read operation for only one unselected word line adjacent to the selected word line. For example, the performing may perform the reliability verification read operation for a (k−1)th word line if the kth word line is the selected word line. In another example, the performing may perform the reliability verification read operation for a (k−1)th word line if the kth word line is the selected word line.

In one embodiment, the reliability verification read operation reads from the unselected word line using read voltages based on whether the unselected word line stores one or more of least significant, intermediate significant, and most significant bits.

In one embodiment, the memory is configured to program memory cells by using a plurality of steps. The plurality of steps includes a 1-step program operation, a coarse program operation and a fine program operation. Here, the performing skips performing the reliability verification read operation if the memory cells associated with the unselected word line are currently programmed according to the coarse program operation.

In one embodiment, the unselected word line is an open word line, and each of the memory cells connected to the open word line are in an erased state.

In one embodiment, the performing performs the reliability verification read operation for each open word line.

In one embodiment, the performing includes reading from the open word line after reading from the selected word line.

In one embodiment, the performing includes reading from at least one of the open word lines before reading from the selected word line, and reading from at least one of the open word lines after reading from the selected word line.

In one embodiment, the performing includes reading from the open word line before reading from the selected word line.

In one embodiment, the performing includes reading from at least one of the open word lines after reading from the selected word line, and reading from at least one other of the open word lines after reading from a next selected word line.

In one embodiment, the performing performs the reliability verification read operation for at least one unselected word line adjacent to the selected word line and performs the reliability verification read operation for at least one open word line if any open word lines exist. The memory cells connected to the open word line are in an erased state.

In one embodiment, the method further includes determining if data read during the reliability verification read operation meets a condition, and performing a control operation if the condition is met. For example, the condition may be, if a bit error rate of the data read during the read verification operation is greater than a threshold. Here, the control operation may copy data of a block including the selected word line to a new block and close the block including the selected word line. As another example, the condition may be, if a number of off memory cells read during the reliability verification read operation is greater than a threshold. Here, the control operation may close the block including the selected word line.

In another embodiment of the method of operating a memory, the method includes reading, by the memory, data based on a read command. The read command is for a selected word line of the memory. The method further includes reading, by the memory, data from an unselected word line if a count value meets a threshold requirement. The unselected word line is not the selected word line, and the count value is based on a number of read commands.

At least one embodiment is directed to a method of operating a memory system.

In one embodiment of this method, the method includes determining, by a memory controller, whether to perform a reliability verification read operation based on a count value and a reference value. The count value is based on a number of read operations performed by the memory controller on a memory, and the reliability verification read operation is for reading data from at least one memory cell associated with at least one unselected word line in the memory. The unselected word line is a word line not selected during a read operation. The method further includes reading, by the memory, data from the unselected word line under control of the memory controller if determining determines to perform the reliability verification read operation.

At least one embodiment is directed to a method of operating a nonvolatile memory system. In one embodiment, the method includes performing a read operation on nonvolatile memory cells connected to a selected wordline in a selected block in a nonvolatile memory device, and determining, by a memory controller, whether to perform a reliability verification read operation based on a count value and a reference value. The count value is based on a number of read commands issued by the memory controller to the nonvolatile memory, and the reliability verification read operation is for reading threshold voltage distributions from at least one of the nonvolatile memory cells associated with at least one unselected wordline in the selected block. The unselected wordline is a wordline not selected during the read operation and not programmed after an erase operation. The method further includes performing the reliability verification read operation for the at least one unselected wordline based on the determining.

Another embodiment of the method includes performing a read operation on nonvolatile memory cells connected to a selected wordline in a selected block in a nonvolatile memory device, and performing a reliability verification read operation. The reliability verification read operation is for reading data from at least one of the nonvolatile memory cells with at least one unselected wordline in the selected block. The unselected wordline is a wordline not selected during the read operation. The method further includes determining whether performing a post-process for the selected block based on a result of the reliability verification read operation.

At least one example embodiment relates to a memory controller.

In one embodiment, the memory controller includes a counter configured to generate a count value based on a number of read commands issued by the memory controller to a memory; and a read controller configured to perform a read operation and configured to determine whether to perform a reliability verification read operation based on the count value and a reference value. The reliability verification read operation is for reading data from at least one memory cell associated with at least one unselected word line in the memory. The unselected word line is a word line not selected during the read operation. The read controller is configured to performing the reliability verification read operation for the at least one unselected word line based on the determination.

In one embodiment, the memory controller further includes a first register configured to store a desired value.

In one embodiment, the memory controller further includes a random number generator configured to generate a random number based on the desired value. Here, the read controller is configured to determine whether to perform the reliability verification read operation using the random number as the reference value.

In one embodiment, the memory controller further includes a second register storing information about program/erase cycles of the memory. Here, the memory controller is configured to change the desired value based on the information.

At least one embodiment is related to a memory system.

In one embodiment, the memory system includes at least one memory and a memory controller. The memory controller is configured to control the memory, and the memory controller configured to determine whether to perform a reliability verification read operation based on a count value and a reference value. The count value is based on a number of read operations performed by the memory controller on the memory, and the reliability verification read operation is for reading data from at least one memory cell associated with at least one unselected word line in the memory. The unselected word line is a word line not selected during a read operation. The memory controller is configured to perform the reliability verification read operation for the at least one unselected word line based on the determining.

In one embodiment, the memory is a non-volatile memory. For example, the memory includes strings of memory cells, each string including a plurality of memory cells connected in series, and the plurality of memory cells in a string are associated with different word lines.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 4 is a table illustrating disturbance generated when a read operation on a specific word line of a nonvolatile memory is iterated;

FIG. 5 is a table illustrating disturbance generated when read operations are performed alternately and iteratively with respect to specific word lines of a nonvolatile memory;

FIG. 12 is a diagram illustrating a method in which a memory controller 1200 manages a random number and a count value;

FIG. 15 is a diagram illustrating another method in which a memory controller 1200 manages a random number and a count value;

FIG. 18A is a table illustrating first examples of a post operation executed after reliability verification read;

FIG. 18B is a table illustrating second examples of a post operation executed after reliability verification read;

DETAILED DESCRIPTION

Figure 1:
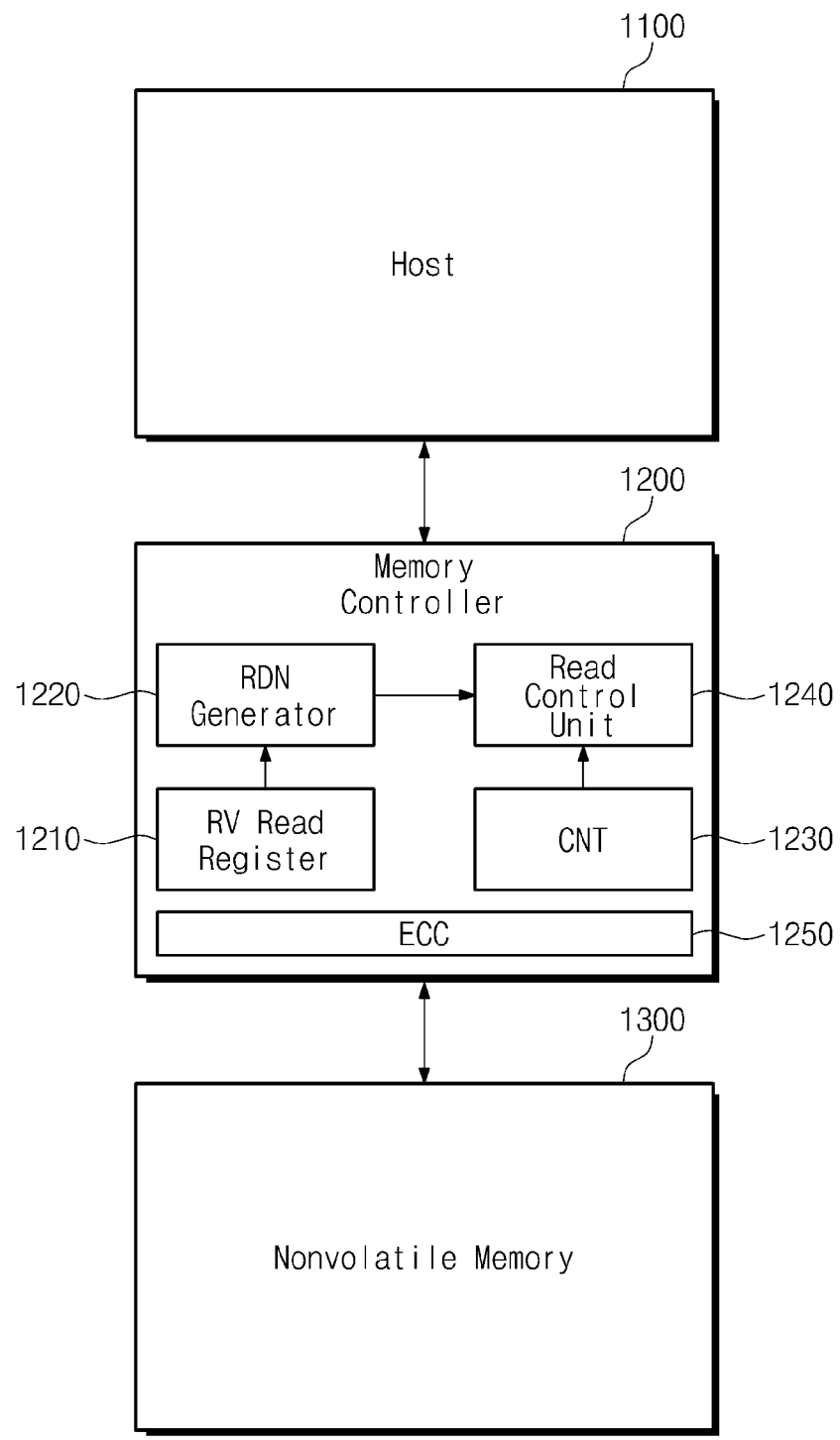
FIG. 1 is a block diagram schematically illustrating a computing system according to an embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The term "selected word line" may be used to indicate a word line, connected with a cell transistor to be written or read, from among a plurality of word lines. The term "unselected word line" or "unselected word lines" may be used to indicate the remaining word line or the remaining word lines of a plurality of word lines other than a selected word line or selected word lines.

The term "selected memory cell" or "selected memory cells" may be used to indicate a memory cell or memory cells to be written or read from a plurality of memory cells. The term "unselected memory cell" or "unselected memory cells" may be used to indicate the remaining memory cell or the remaining memory cells of a plurality of memory cells other than a selected memory cell or selected memory cells.

FIG. 1 is a block diagram schematically illustrating a computing system 1000 according to an embodiment of the inventive concept. Referring to FIG. 1, a computing system 1000 may include a host 1100, a memory controller 1200, and a nonvolatile memory 1300.

The host 1100 may be configured to access the nonvolatile memory 1300 through the memory controller 1200. The host 1100 may be one or more electronic devices using the nonvolatile memory 1300 as storage or a memory. For example, the host 1100 may include electronic devices such as a computer, a notebook computer, a smart phone, a smart pad, a smart television, a netbook, and so on.

The memory controller 1200 may be configured to access the nonvolatile memory 1300 according to a control of the host 1100. The memory controller 1200 may receive a write, read or erase command from the host 1100 to control a write, read or erase operation of the nonvolatile memory 1300. The memory controller 1200 may perform a variety of background operations for controlling the nonvolatile memory 1300 without directions of the host 1100. The memory controller 1200 may control the nonvolatile memory 1300 to perform a reliability verification read operation. The reliability verification read operation is for reading data from at least one memory cell associated with at least one unselected word line as will be described in greater detail below. Also, the reliability verification read operation may be a read operation on a storage space of the nonvolatile memory 1300 without an input of a read command from the host 1100. The memory controller 1200 may perform the reliability verification read operation to improve the reliability of the nonvolatile memory 1300.

The memory controller 1200 may include a reliability verification read register 1210, a random number generator 1220, a counter 1230, a read control unit 1240, and an error correction unit 1250.

The reliability verification read register 1210 may store various information for the reliability verification read operation executed under a control of the memory controller 1200. For example, the reliability verification read register 1210 may store information about a frequency of reliability verification read operations executed, information about the number of reliability verification read operations executed, information about a location where a reliability verification read operation is performed, and so on. The reliability verification read register 1210 may be programmed by an external device (e.g., host 1100 or test device).

The random number generator 1220 may generate a random number based on information stored at the reliability verification read register 1210. For example, the random number generator 1220 may sequentially generate random numbers based on a desired value (e.g., a frequency of reliability verification read operations executed) stored at the reliability verification read register 1210. Herein, an average value of the random numbers may have the desired value.

The counter 1230 may count the event that a read command is issued by the memory controller 1200 to the nonvolatile memory 1300. For example, the counter 1230 may increase a count value whenever a read command is issued by the memory controller 1200. Alternatively, the counter 1230 may manage count values on respective areas of the nonvolatile memory 1300. The counter 1230 may increase a first count value whenever a read command corresponding to a first area of the nonvolatile memory 1300 is issued by the memory controller 1200. The counter 1230 may increase a second count value whenever a read command corresponding to a second area of the nonvolatile memory 1300 is issued by the memory controller 1200.

The read control unit 1240 may receive a random number from the random number generator 1220 and a count value from the counter 1230. When the count value equals or exceeds the random number, the read control unit 1240 may control the nonvolatile memory 1300 to perform a reliability verification read operation. Also, in response to a read command and an address corresponding to an area having a count value that equals or exceeds a random number, the read control unit 1240 may control the nonvolatile memory 1300 to perform a reliability verification read operation. Based on a result of the reliability verification read operation, the read control unit 1240 may control the nonvolatile memory 1300 to perform a post operation.

The error correction unit 1240 may add parity information for error correction to data to be written at the nonvolatile memory 1300. The error correction unit 1240 may perform error correction on data read from the nonvolatile memory 1300, based on parity information of the read data.

The nonvolatile memory 1300 may operate according to a control of the memory controller 1200. The nonvolatile memory 1300 may include at least one of nonvolatile memories such as a flash memory, a PRAM, an MRAM, an RRAM, a FRAM, and so on.

The memory controller 1200 and the nonvolatile memory 1300 may constitute a memory system which stores data according to a control of the host 1100.

Figure 2:
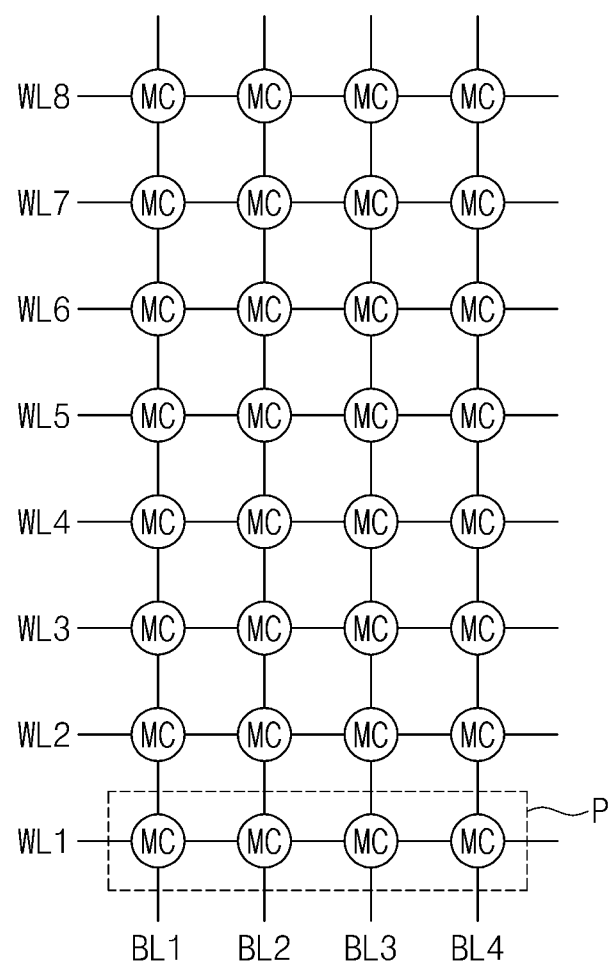
FIG. 2 is block diagram schematically illustrating memory cells of a nonvolatile memory.

FIG. 2 is block diagram schematically illustrating memory cells MC of the nonvolatile memory 1300. Referring to FIG. 2, memory cells MC may be connected with word lines WL1 to WL8 and bit lines BL1 to BL4. The memory cells MC may be arranged along rows and columns. For example, memory cells arranged along a row direction may be connected in common with a word line. Memory cells arranged along a column direction may be connected in common with a bit line. Memory cells arranged along a row direction, that is, memory cells connected in common with a word line may form a page P.

Each of the memory cells MC may store one or more bits. When each memory cell MC stores two or more bits, a page may include a plurality of logical pages. Least significant bits (LSBs) stored at memory cells MC in a page P may constitute a logical page, and most significant bits (MSBs) stored at the memory cells MC in the page P may constitute another logical page. When memory cells MC store central significant bits (CSBs) between the least significant bits (LSBs) and the most significant bits (MSBs), the central significant bits (CSBs) may constitute still another logical page.

In FIG. 2, there is illustrated an example in which memory cells MC are connected with eight word lines WL1 to WL8 and four bit lines BL1 to BL4. However, the inventive concepts are not limited thereto. The number of memory cells of a nonvolatile memory 1300 (refer to FIG. 1) may not be limited. Also, the number of bits stored at each memory cell MC may not be limited.

Figure 3:
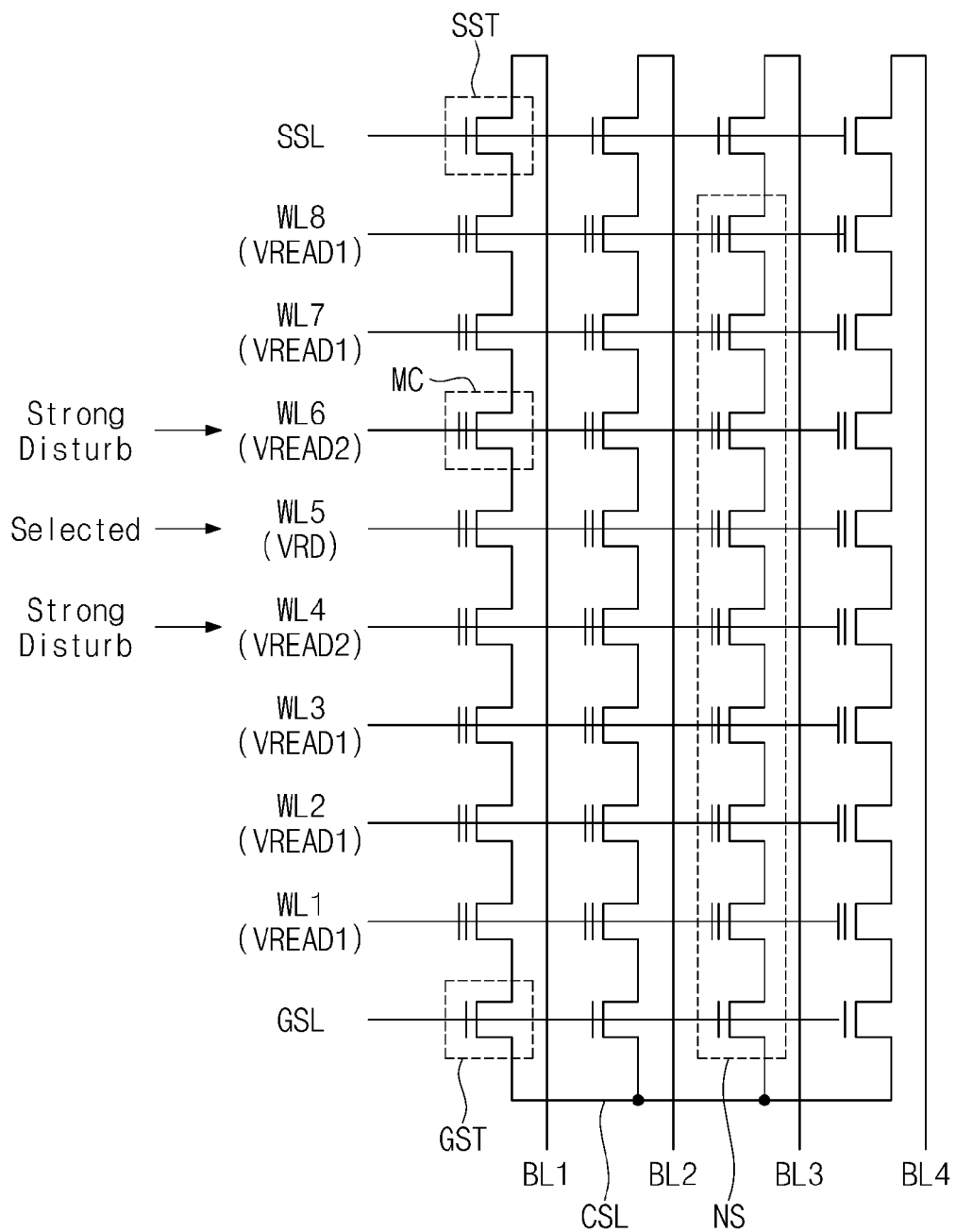
FIG. 3 is a circuit diagram illustrating a voltage condition applied to memory cell at a read operation.

FIG. 3 is a circuit diagram illustrating a voltage condition applied to a memory cell at a read operation. In FIG. 3, a flash memory may be illustrated exemplarily. However, the inventive concepts are not limited thereto.

Referring to FIG. 3, a plurality of memory cells connected in series may constitute a NAND string NS. A string selection transistor SST may be connected to one end of each NAND string NS and a ground selection transistor GST may be connected to the other end thereof.

In the NAND strings NS, gates of the ground selection transistors GST may be connected in common to a ground selection line GSL, gates of the string selection transistors SST may be connected in common to a string selection line SSL, and memory cells MC may be connected to word lines WL1 to WL8, respectively. Memory cells at the same location as the ground selection transistors GST may be connected in common to a word line. The string selection transistors SST in the NAND strings NS may be connected to bit lines BL1 to BL4, respectively.

Assume during a read operation, a word line WL5 is selected. A selection read voltage VRD may be applied to the selected word line WL5. A second non-selection read voltage VREAD2 may be applied to word lines WL4 and WL6, adjacent to the selected word line WL5, from among unselected word lines WL1 to WL4 and WL6 to WL8. A first non-selection read voltage VREAD1 may be applied to the remaining word lines WL1 to WL3, WL7, and WL8 of the unselected word lines WL1 to WL4 and WL6 to WL8 other than the word lines WL4 and WL6.

The selection read voltage VRD may be a voltage for determining threshold voltages of memory cells MC connected with the selected word line WL5. The selection read voltage VRD may have a voltage level among threshold voltages of the memory cells MC. The selection read voltage VRD may be lower than the first non-selection read voltages VREAD1 and VREAD2.

A first non-selection read voltage VREAD1 may be a voltage for turning on memory cells connected with the unselected word lines WL1 to WL3, WL7, and WL8. The first non-selection read voltage VREAD1 may be higher than threshold voltages of the memory cells MC. The first non-selection read voltage VREAD1 may be a high voltage, higher than the selection read voltage VRD.

A second non-selection read voltage VREAD1 may be a voltage for turning on memory cells connected with the unselected word lines WL4 and WL6 adjacent to the selected word line WL5. The selection read voltage VRD applied to the selected word line WL5 may be lower than the first non-selection read voltage VREAD1. When the first non-selection read voltage VREAD1 is applied to the word lines WL4 and WL6 adjacent to the selected word line WL5, an electric field generated by the first non-selection read voltage VREAD1 may be distributed into a direction of the selected word line WL5. That is, when the same read voltage is applied to the unselected word lines WL1 to WL4 and WL6 to WL8, an electric field formed at the unselected word lines WL4 and WL6 adjacent to the selected word line WL5 may be weaker than that formed at the remaining unselected word lines WL1 to WL3, WL7, and WL8. To prevent this phenomenon, the second non-selection read voltage VREAD2 applied to the unselected word lines WL4 and WL6 adjacent to the selected word line WL5 may be set to be higher than the first non-selection read voltage VREAD1.

When a read operation is performed, memory cells connected to the unselected word lines WL1 to WL4 and WL6 to WL8 may experience disturbance due to the non-selection read voltages VREAD1 and VREAD2. Since the highest voltage (e.g., VREAD2) is applied to the unselected word lines WL4 and WL6 adjacent to the selected word line WL5, memory cells of the unselected word lines WL4 and WL6 may experience the strongest disturbance. The disturbance generated at the read operation may cause a variation in threshold voltages of memory cells, so that data stored at a nonvolatile memory 1300 (refer to FIG. 1) is damaged.

FIG. 4 is a table illustrating disturbance generated when a read operation on a specific word line of a nonvolatile memory 1300 is iterated. Referring to FIG. 4, if read operations are iteratively performed k times with respect to a word line WL5, word lines WL4 and WL6 adjacent to the word line WL5 may experience strong disturbance k times.

FIG. 5 is a table illustrating disturbance generated when read operations are performed alternately and iteratively with respect to specific word lines of a nonvolatile memory 1300. Referring to FIG. 5, if 2k read operations are alternately and iteratively performed with respect to word lines WL3 and WL5, adjacent word lines WL2 and WL6 may experience disturbance k times, and the word line WL4 between the word line WL5 and the word line WL6 may experience disturbance 2k times.

As described with reference to FIGS. 3 to 5, when a read operation of a nonvolatile memory 1300 is performed, word lines adjacent to a selected word line may suffer strong disturbance. In particular, when read operations are iteratively performed with respect to a specific word line or specific word lines, memory cells connected with the adjacent word lines may suffer strong disturbance cumulatively. In this case, data stored at the memory cells suffering strong disturbance cumulatively may be damaged.

To prevent the above-described phenomenon, whenever the number of read operations is greater than or equal to a random number, memory cells connected with unselected word lines may be read through a reliability verification read operation, and a damage level of data stored at the memory cells read may be determined. A post operation for protecting data stored at the memory cells read may be performed according to a result of the determination.

If a reliability verification read operation is performed randomly, a checking frequency of memory cells adjacent to a word line experiencing a read operation frequently may increase. Also, although a read pattern received from a host 1100 (refer to FIG. 1) has a periodicity, disturbance of memory cells in the nonvolatile memory 1300 may be checked overall regardless of the periodicity of the read pattern. Thus, the reliability of a memory controller 1200 and a memory system 1200/1300 may be improved.

Figure 6:
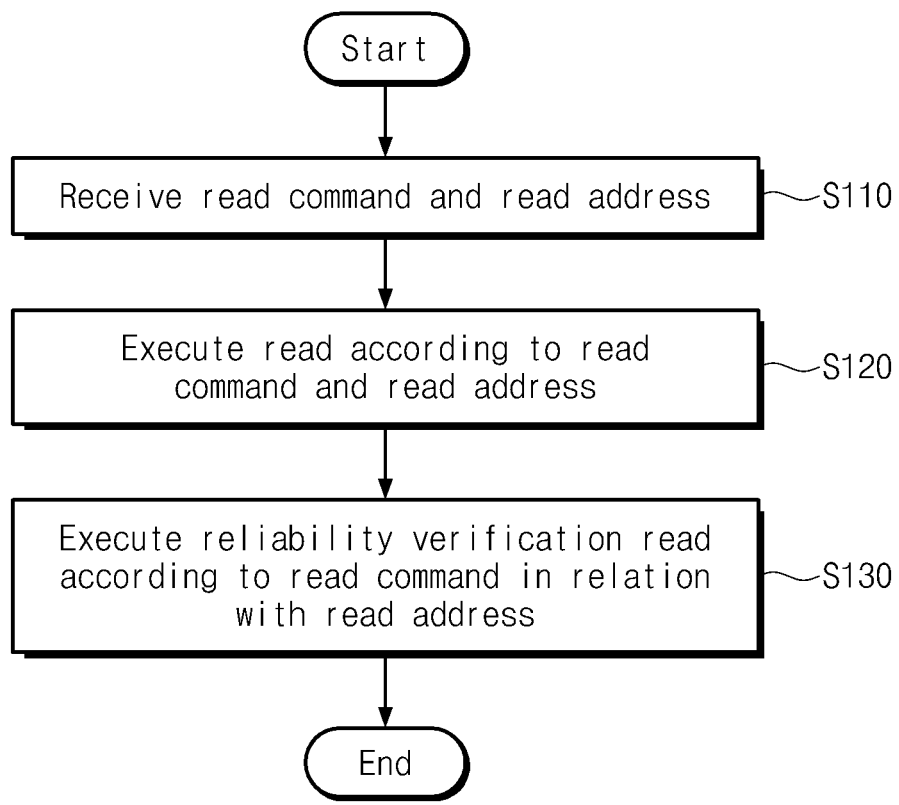
FIG. 6 is a flow chart illustrating an operating method of a memory system according to an embodiment of the inventive concepts.

FIG. 6 is a flow chart illustrating an operating method of a memory system according to an embodiment of the inventive concepts. Referring to FIGS. 1 and 6, in operation S110, a read command and a read address may be received. A memory controller 1200 may receive the read command and the read address from a host 1100.

In operation S120, a read operation may be performed according to the read command and the read address. The memory controller 1200 may control a nonvolatile memory 1300 to perform a read operation, based on the read command and the read address received from the host 1100. The memory controller 1200 may convert the read address input from the host 1100 into an address for the nonvolatile memory 1300. The memory controller 1200 may generate a read command for the nonvolatile memory 1300 based on the read command input from the host 1100. The memory controller 1300 may provide the nonvolatile memory 1300 with the converted read address and the generated read command.

The memory controller 1200 may receive data read from the nonvolatile memory 1300 for transmission to the host 1100.

In operation S130, a reliability verification read operation associated with the received read address may be performed according to the read command issued by the memory controller 1200. When issuing this read command satisfies a specific condition, the memory controller 1200 may perform the reliability verification read operation. For example, when a value counted by a counter 1230 equals or exceeds a random number generated by a random number generator 1220, the memory controller 1200 may control the nonvolatile memory 1300 to perform the reliability verification read operation.

When the reliability verification read operation is performed, the memory controller 1200 may generate the same read command as that when a typical read operation is performed. As another example, the memory controller 1200 may generate a separate command for the reliability verification read operation. The memory controller 1200 may generate an address for the reliability verification read operation, based on a read address associated with the issued read command triggering the reliability verification read operation. The memory controller 1200 may provide the nonvolatile memory 1300 with the generated address and command.

The memory controller 1200 may receive data read from the nonvolatile memory 1300, and may perform a post operation based on the received data. For example, the memory controller 1300 may perform a post operation for protecting data which is capable of being damaged by read disturbance.

While the embodiment of FIG. 6 describes the reliability verification read operation being triggered after receipt of a read command from the host, the memory controller 1200 may perform the reliability verification read operation, when not triggered by the host 1100. The memory controller 1200 may read data from the nonvolatile memory 1300 as part of a background operation to manage the nonvolatile memory 1300. A read command issued by the memory controller 1200 during these read operations may trigger the reliability verification read operation. Namely, the count value may increment to a value that equals or exceeds the random number in response to the issued read command. At this time, the data read through the reliability verification read operation may not be output to the host 1100.

Furthermore, while read command may be issued by the memory controller 1200 during the reliability verification read operation, in at least one embodiment, the counter 1230 does not increment the count value in response to these issued read commands.

Figure 7:
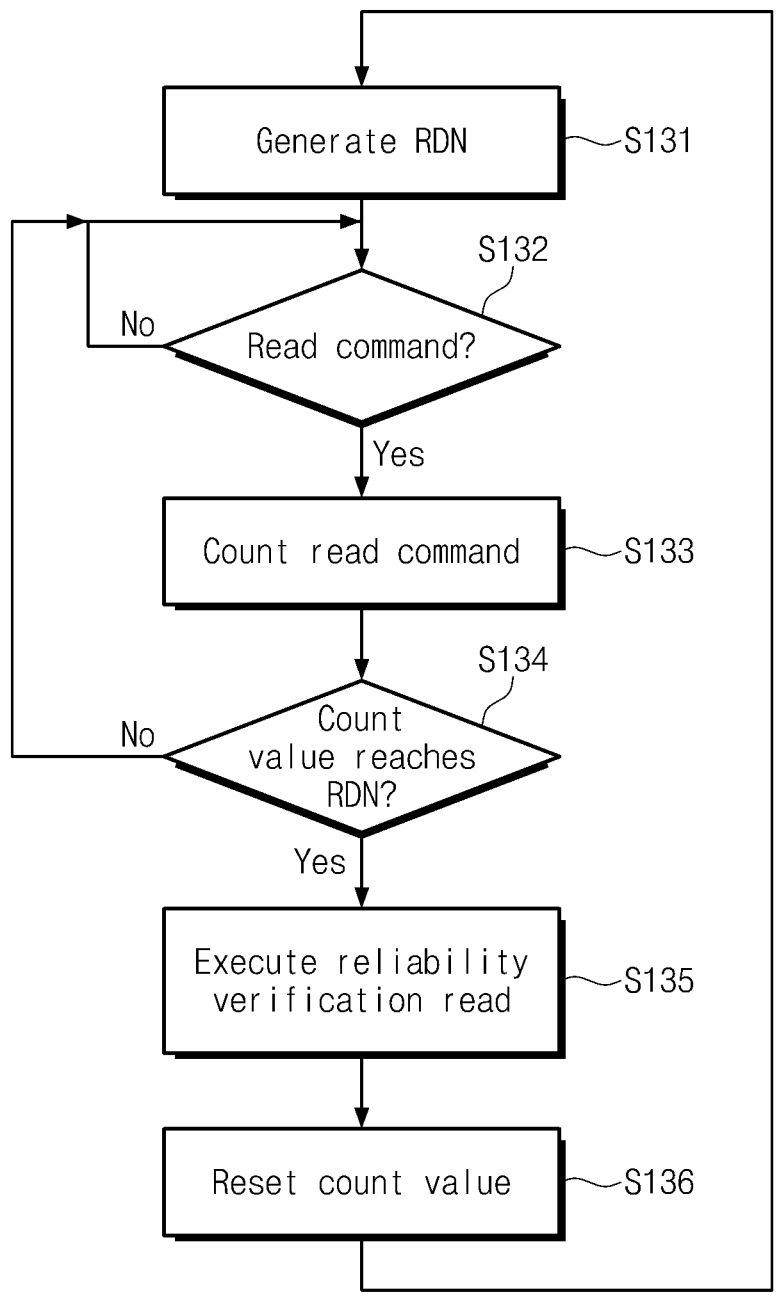
FIG. 7 is a flow chart illustrating a condition for a reliability verification read operation of a memory controller.

FIG. 7 is a flow chart illustrating a condition for a reliability verification read operation of a memory controller 1200. Referring to FIGS. 1 and 7, in operation S131, a random number may be generated. For example, a random number generator 1220 may generate a random number based on a reference value stored at a reliability verification read register 1210. The random number generator 1220 may sequentially generate random numbers one by one under the control of a read control unit 1240. An average value of the random numbers sequentially generated from the random number generator 1220 may be a reference value stored at the reliability verification read register 1210.

In operation S132, further processing may not be performed until a read command is issued. If a read command is issued, the method proceeds to operation S133.

In operation S133, the read command may be counted. A counter 1230 may increase a count value according to a read command issued by the memory controller 1200. As an example, whenever a read command is issued by the memory controller 1200, the counter 1230 may increase a count value regardless of a read address. As another example, the counter 1230 may manage a plurality of count values corresponding to a plurality of areas of a nonvolatile memory 1300, respectively. The counter 1230 may increase a count value corresponding to an area of the nonvolatile memory 1300 designated by a read address associated with the issued read command.

In operation S134, whether the count value is great than or equal to a random number may be determined. The read control unit 1240 may receive a random number from the random number generator 1220 and a count value from the counter 1230. The read control unit 1240 may compare the received random number and the received count value to determine whether the count value is greater than or equal to the random number. The read control unit 1240 may determine whether at least one of count values of the counter 1230 is greater than or equal to a random number. In example embodiments, in the event that the counter 1230 manages a plurality of count values, the random number generator 1220 may manage a plurality of random numbers. The random numbers may correspond to the count values, respectively. The random numbers may have an average value identical or approximate to a reference value stored at the reliability verification read register 1210.

If the count value does not equal or exceed the random number, the reliability verification read operation may not be performed, and the method proceeds to operation S132.

If the count value equals or exceeds the random number, in operation S135, the memory controller 1200 performs the reliability verification read operation. In operation S136, the memory controller 1200 resets the count value. Afterwards, the method proceeds to operation S131 to generate a random number again. If the counter 1230 manages a plurality of count values, in operation S136, a count value associated with a read address of the issued read command, that is, a count value causing the reliability verification read operation may be reset. In operation S131, a random number associated with the reset count value may be again generated. Afterwards, the method proceeds to operation S133.

The above-described operations S131 to S136 may continue to be performed while the memory controller 1200 and the nonvolatile memory 1300 are powered. The above-described operations S131 to S136 may be stopped when the memory controller 1200 and the nonvolatile memory 1300 are powered off.

A random number generated from the random number generator 1220 may be retained even though the memory controller 1200 and the nonvolatile memory 1300 are powered off. For example, a random number may be stored at a nonvolatile memory in the memory controller 1200 or backed up to the nonvolatile memory 1300. A count value managed by the counter 1230 may be retained even though the memory controller 1200 or the nonvolatile memory 1300 is powered off. For example, a count value managed by the counter 1230 may be stored at a nonvolatile memory in the memory controller 1200 or backed up to the nonvolatile memory 1300.

Figure 8A:
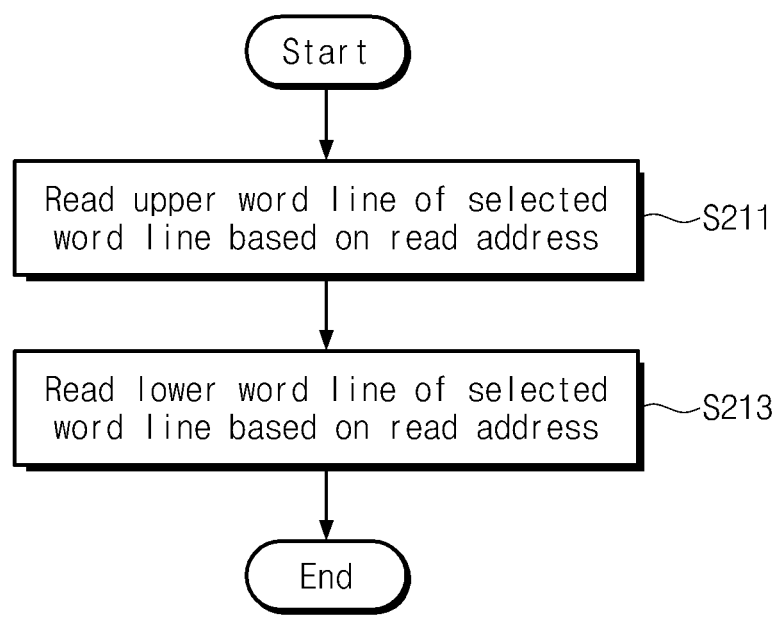
FIG. 8A is a flow chart illustrating a reliability verification read method according to an embodiment of the inventive concepts.

FIG. 8A is a flow chart illustrating a reliability verification read method according to an embodiment of the inventive concepts. Referring to FIGS. 1 and 8A, in operation S211, an upper word line adjacent to a selected word line may be read based on a read address. When a count value according to an input of a read command equals or exceeds a random number, the memory controller 1200 may control a nonvolatile memory 1300 to read memory cells connected with an upper word line adjacent to the selected word line, selected based on a read address associated with the read command. For example, when the read address appoints a kth word line, the memory controller 1200 may generate an address corresponding to a (k+1)th word line for reliability verification reading. The memory controller 1200 may transfer the generated address and a read command to the nonvolatile memory 1300 to perform a reliability verification read operation.

In operation S213, a lower word line adjacent to the selected word line may be read based on a read address. When a count value according to an input of a read command equals or exceeds a random number, the memory controller 1200 may control the nonvolatile memory 1300 to read memory cells connected with a lower word line adjacent to the selected word line, selected based on a read address associated with the read command. For example, when the read address appoints the kth word line, the memory controller 1200 may generate an address corresponding to a (k−1)th word line for reliability verification read. The memory controller 1200 may transfer the generated address and a read command to the nonvolatile memory 1300 to perform the reliability verification read operation.

In example embodiments, if the selected word line is located at an edge, that is, if an upper word line or a lower word line does not exist, one of the above-described operations S211 and S213 may be skipped.

Figure 8B:
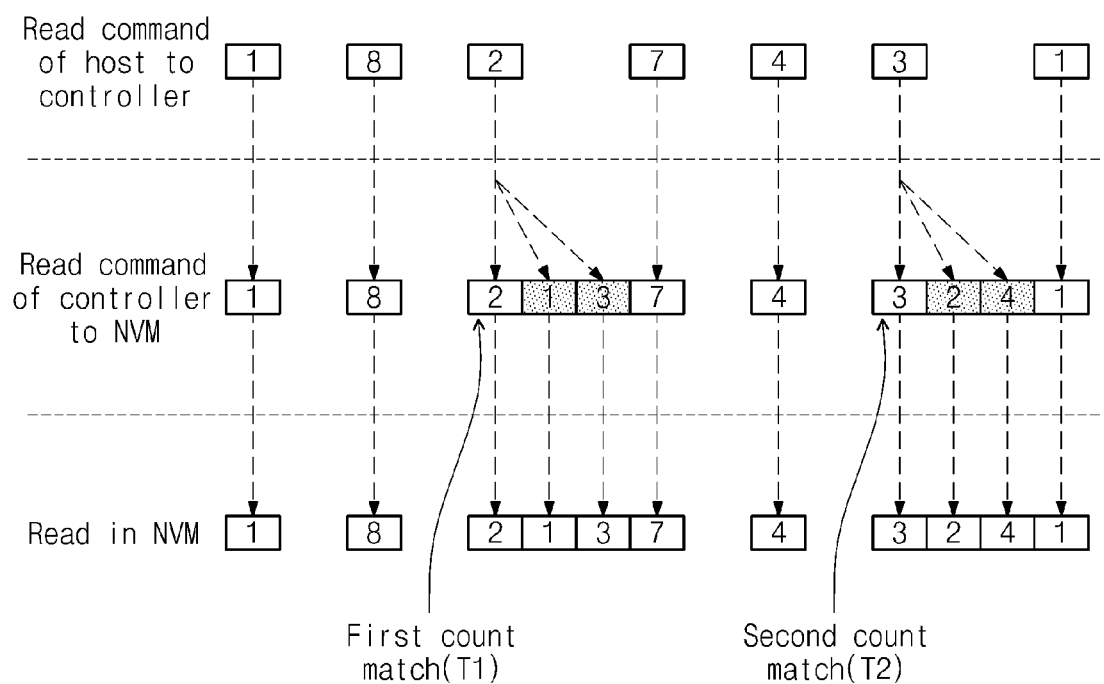
FIG. 8B is a diagram illustrating a reliability verification read operation according to a reliability verification read method of FIG. 8A.

FIG. 8B is a diagram illustrating a reliability verification read operation according to a reliability verification read method of FIG. 8A. In FIG. 8B, numbers in boxes may indicate word line numbers. Referring to FIGS. 1 and 8B, a host 1100 may transfer read commands of word lines 1 and 8 sequentially to a memory controller 1200. Whenever a read command is received, the memory controller 1200 may increase a count value.

The memory controller 1200 may transfer read commands of the word lines 1 and 8 to a nonvolatile memory 1300. The memory controller 1200 may transfer data read from the nonvolatile memory 1300 to the host 1100.

At a first time T1, the host 1100 may send a read command of a word line 2 to the memory controller 1200, which then issues a read command to the nonvolatile memory 1300. At this time, a read command count value may equal or exceed a random number.

The memory controller 1200 may transfer data read from the nonvolatile memory 1300 to the host 1100. Afterwards, the memory controller 1200 may sequentially transfer read commands of lower and upper word lines 1 and 3 adjacent to the selected word line 2 to the nonvolatile memory 1300. The memory controller 1200 may use data of the word lines 1 and 3 read from the nonvolatile memory 1300 for a post operation to manage the nonvolatile memory 1300. At this time, the data of the word lines 1 and 3 read from the nonvolatile memory 1300 may not be transferred to the host 1100.

The host 1100 may send read commands of word lines 7 and 4 to the memory controller 1200. The memory controller 1200 may transfer the read commands of the word lines 7 and 4 to the nonvolatile memory 1300, and may provide the host 1100 with data read from the word lines 7 and 4.

At a second time T2, the host 1100 may send a read command of a word line 3 to the memory controller 1200, which causes the memory controller 1200 to issue a corresponding read command to the nonvolatile memory 1300. At this time, a read command count value may become greater than or equal to the random number.

The memory controller 1200 may transfer data read from the nonvolatile memory 1300 to the host 1100. Afterwards, the memory controller 1200 may sequentially transfer read commands of lower and upper word lines 2 and 4 adjacent to the selected word line 3 to the nonvolatile memory 1300. The memory controller 1200 may use data of the word lines 2 and 4 read from the nonvolatile memory 1300 for a post operation to manage the nonvolatile memory 1300. At this time, the data of the word lines 2 and 4 read from the nonvolatile memory 1300 may not be transferred to the host 1100. The memory controller 1200 may reset the count value to generate a new random number.

The host 1100 may send a read command of a word line 1 to the memory controller 1200. The memory controller 1200 may transfer the read command of the word line 1 to the nonvolatile memory 1300, and may provide the host 1100 with data read from the word line 1.

In example embodiments, a voltage condition for the reliability verification read operation may be different from that of a read operation. For example, the number and levels of read voltages for the reliability verification read operation may be different from the number and levels of read voltages for the read operation.

In example embodiments, a command for the reliability verification read operation, which the memory controller 1200 transfers to the nonvolatile memory 1300 may be equal to that for the read operation. The memory controller 1200 may change a voltage condition of the nonvolatile memory 1300 to perform the reliability verification read operation. For example, after a read operation on the word line 2 is performed, the memory controller 1200 may provide the nonvolatile memory 1300 with a setup command (not shown) to change a voltage condition into a voltage condition for the reliability verification read operation. After a voltage condition is changed according to the setup command, the memory controller 1200 may transfer read commands of the word lines 1 and 3 to the nonvolatile memory 1300. That is, the memory controller 1200 may perform the reliability verification read operation by sending the setup command and the read commands of the word lines 1 and 3 to the nonvolatile memory 1300.

After the reliability verification read operation is completed, the memory controller 1200 may provide the nonvolatile memory 1300 with a second setup command (not shown) to change a voltage condition into a voltage condition for a read operation (e.g., a normal read operation). The memory controller 1200 may perform the reliability verification read operation in response to the read command of the word line 2 causing the reliability verification read operation, and then may provide the nonvolatile memory 1300 with the second setup command. In other example embodiments, in response to the read command of the word line 7 following the read command of the word line 2 causing the reliability verification read operation, the memory controller 1200 may send the second setup command to the nonvolatile memory 1300 before a read operation according to the read command of the word line 7.

In still other example embodiments, the memory controller 1200 may include separate commands for the read operation and the reliability verification read operation.

Figure 8C:
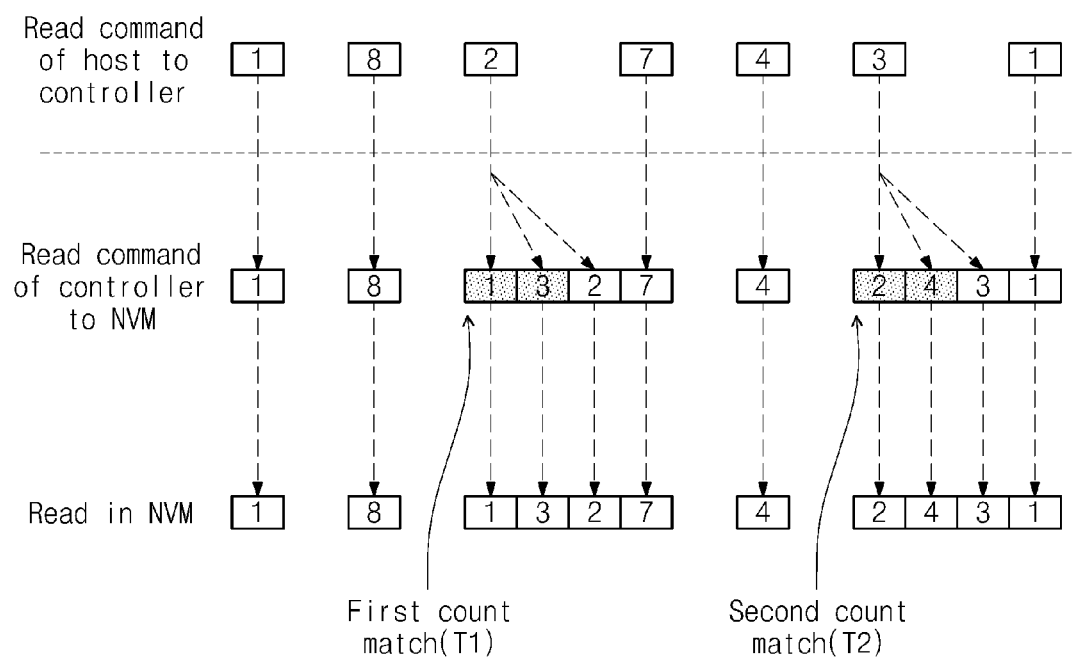
FIG. 8C is a diagram illustrating another embodiment of a reliability verification read operation according to a reliability verification read method of FIG. 8A.

FIG. 8C is a diagram illustrating another embodiment of a reliability verification read operation according to a reliability verification read method of FIG. 8A. Compared with FIG. 8B, if a count value equals or exceeds the random number at a first time T1, a memory controller 1200 may control a nonvolatile memory 1300 to perform reliability verification read operations on word lines 1 and 3 adjacent to a selected word line 2 and then to perform a read operation on the selected word line 2. Likewise, if a count value equals or exceeds a new random number at a second time T2, the memory controller 1200 may control the nonvolatile memory 1300 to perform the reliability verification read operations on word lines 2 and 4 adjacent to a selected word line 3 and then to perform a read operation on the selected word line 3.

In FIGS. 8B and 8C, there is illustrated an example in which at the reliability verification read operation, memory cells of a lower word line (e.g., (k−1)th word line) adjacent to a selected word line (e.g., kth word line) are read and then memory cells of an upper word line (e.g., (k+1)th word line) adjacent to the selected word line are read. However, the inventive concepts are not limited thereto. For example, at the reliability verification read operation, memory cells of an upper word line adjacent to a selected word line may be read, and then memory cells of a lower word line adjacent to the selected word line may be read.

In example embodiments, a command for the reliability verification read operation, which the memory controller 1200 transfers to the nonvolatile memory 1300, may be equal to that for the read operation. The memory controller 1200 may change a voltage condition of the nonvolatile memory 1300 to perform the reliability verification read operation. For example, after a read operation on the word line 2 is performed, the memory controller 1200 may provide the nonvolatile memory 1300 with a setup command (not shown) to change a voltage condition into a voltage condition for the reliability verification read operation. After a voltage condition is changed according to the setup command, the memory controller 1200 may transfer read commands of the word lines 1 and 3 to the nonvolatile memory 1300. That is, the memory controller 1200 may perform the reliability verification read operation by sending the setup command and the read commands of the word lines 1 and 3 to the nonvolatile memory 1300.

After the reliability verification read operation is completed, the memory controller 1200 may provide the nonvolatile memory 1200 with a second setup command (not shown) to change a voltage condition into a voltage condition for a read operation (e.g., a normal read operation). After a voltage condition is changed according to the second setup command, the memory controller 1200 may transfer the read command of the word line 2 to the nonvolatile memory 1300.

In other example embodiments, the memory controller 1200 may include separate commands for the read operation and the reliability verification read operation.

Figure 8D:
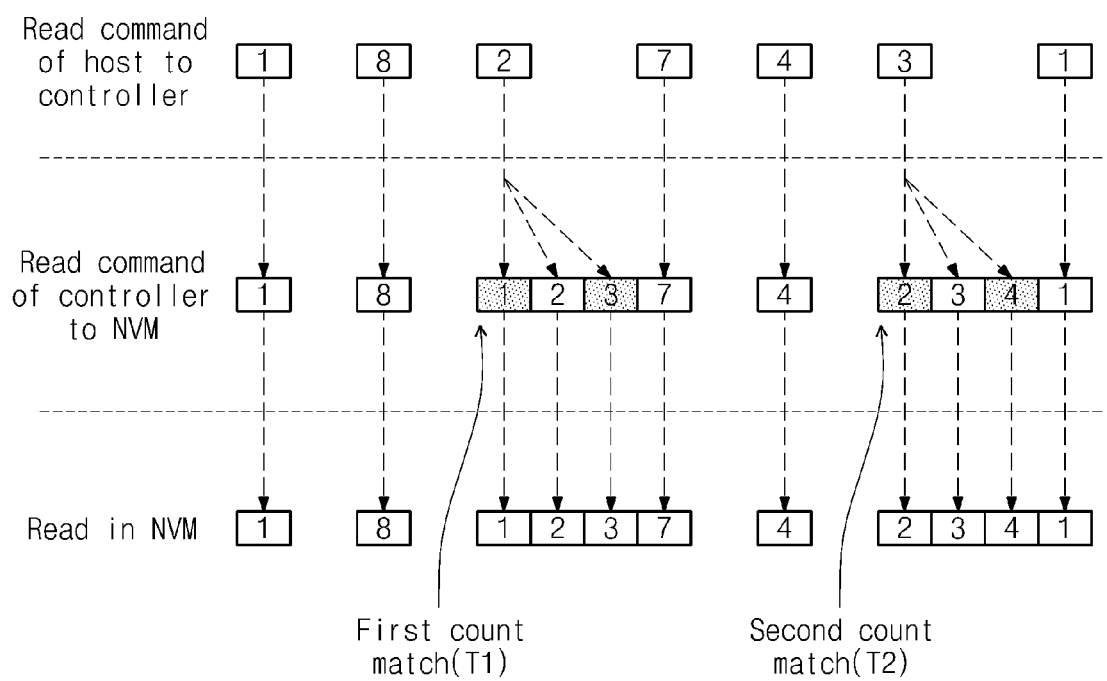
FIG. 8D is a diagram illustrating still another embodiment of a reliability verification read operation according to a reliability verification read method of FIG. 8A.

FIG. 8D is a diagram illustrating still another embodiment of a reliability verification read operation according to a reliability verification read method of FIG. 8A. Compared with FIG. 8B, if a count value equals or exceeds a random number at a first time T1, a memory controller 1200 may control a nonvolatile memory 1300 to sequentially perform a reliability verification read operation on a lower word line 1 adjacent to a selected word line 2, a read operation on the selected word line 2, and a reliability verification read operation on an upper word line 3 adjacent to the selected word line 2. Likewise, if a count value equals or exceeds a random number at a second time T2, the memory controller 1200 may control the nonvolatile memory 1300 to sequentially perform a reliability verification read operation on a lower word line 2 adjacent to a selected word line 3, a read operation on the selected word line 3, and a reliability verification read operation on an upper word line 4 adjacent to the selected word line 3.

The memory controller 1200 may transfer a setup command for changing a voltage condition to the nonvolatile memory 1300, and then may provide the read command of the word line 1 to the nonvolatile memory 1300. After the reliability verification read operation according to the read command of the word line 1 is performed, the memory controller 1200 may transfer a second setup command to the nonvolatile memory 1300. After a voltage condition according to the second setup command is changed, the memory controller 1200 may send the read command of the word line 2 to the nonvolatile memory 1300. After a read operation corresponding to the read command of the word line 2, the memory controller 1200 may provide the setup command to the nonvolatile memory 1300. After a voltage condition is changed according to the setup command, the memory controller 1200 may transfer the read command of the word line 3 to the nonvolatile memory 1300.

After the reliability verification read operation corresponding to the read command of the word line 3 is completed, the memory controller 1200 may provide the nonvolatile memory 1200 with a second setup command. The memory controller 1200 may transfer the second setup command after completion of the reliability verification read operation in response to the read command of the word line 2. In other example embodiments, in response to a read command of a word line 7, the memory controller 1200 may send the second setup command to the nonvolatile memory 1300 before a read operation according to the read command of the word line 7.

In still other example embodiments, the memory controller 1200 may include separate commands for the read operation and the reliability verification read operation.

Figure 8E:
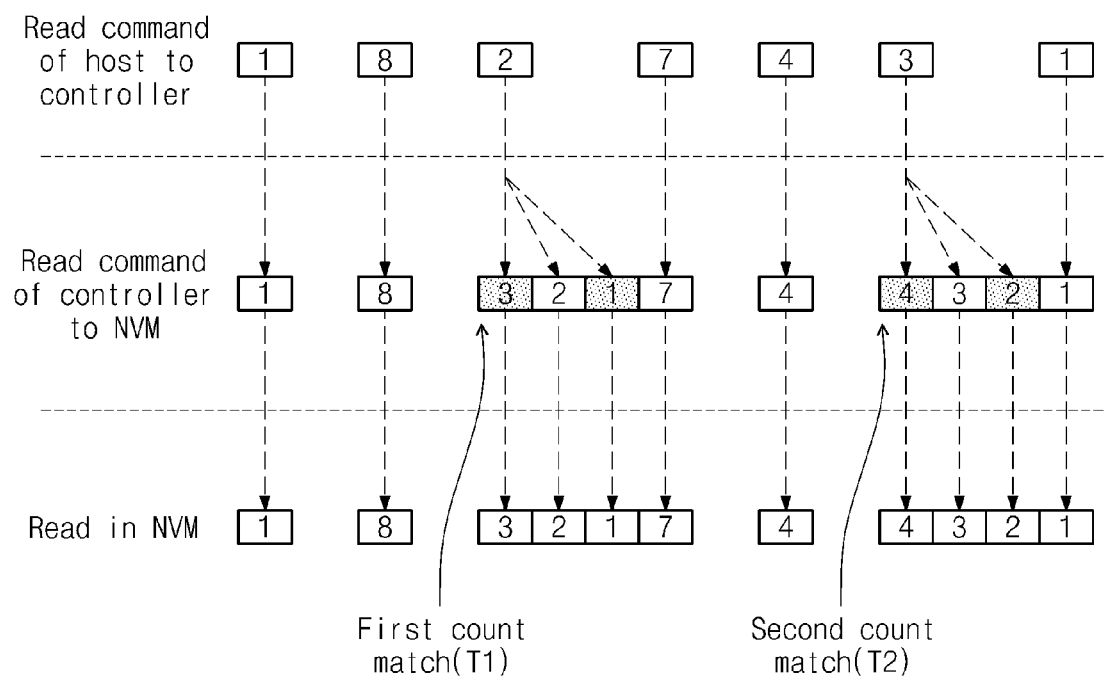
FIG. 8E is a diagram illustrating still another embodiment of a reliability verification read operation according to a reliability verification read method of FIG. 8A.

FIG. 8E is a diagram illustrating still another embodiment of a reliability verification read operation according to a reliability verification read method of FIG. 8A. Compared with FIG. 8B, if a count value equals or exceeds a random number at a first time T1, a memory controller 1200 may control a nonvolatile memory 1300 to sequentially perform a reliability verification read operation on an upper word line 3 adjacent to a selected word line 2, a read operation on the selected word line 2, and a reliability verification read operation on a lower word line 1 adjacent to the selected word line 2. Likewise, if a count value equals or exceeds a random number at a second time T2, the memory controller 1200 may control the nonvolatile memory 1300 to sequentially perform a reliability verification read operation on an upper word line 4 adjacent to a selected word line 3, a read operation on the selected word line 3, and a reliability verification read operation on a lower word line 2 adjacent to the selected word line 3.

Before the reliability verification read operation, the memory controller 1200 may transfer a first setup command for changing a voltage condition to the nonvolatile memory 1300. After completion of the reliability verification read operation, the may transfer a second setup command for recovering a voltage condition to the nonvolatile memory 1300. The first setup command may be transferred according to a read command causing the reliability verification read operation. The second setup command may be transferred according to a read command causing the reliability verification read operation or according to a following read command.

In other example embodiments, the memory controller 1200 may include separate commands for the read operation and the reliability verification read operation.

The manner in which the memory controller 1200 transfers a command for changing a voltage condition or the memory controller 1200 includes separate commands for the read operation and the reliability verification read operation may be applied to embodiments which will be described later. Also, modifications and changes to this may be made without departing from the spirit of the inventive concept.

Furthermore, while the above described embodiments of FIGS. 8A-8E and the embodiments of FIGS. 9A-10B discussed below assumed the read command issued by the memory controller 1200 that triggered the reliability verification read operation corresponded to a read command from the host 1100, it will be understood that the read command issued from the memory controller 1200 that triggers the reliability verification read operation may not result from a read command received from the host 1100 (e.g., may issue during a background operation).

Figure 9A:
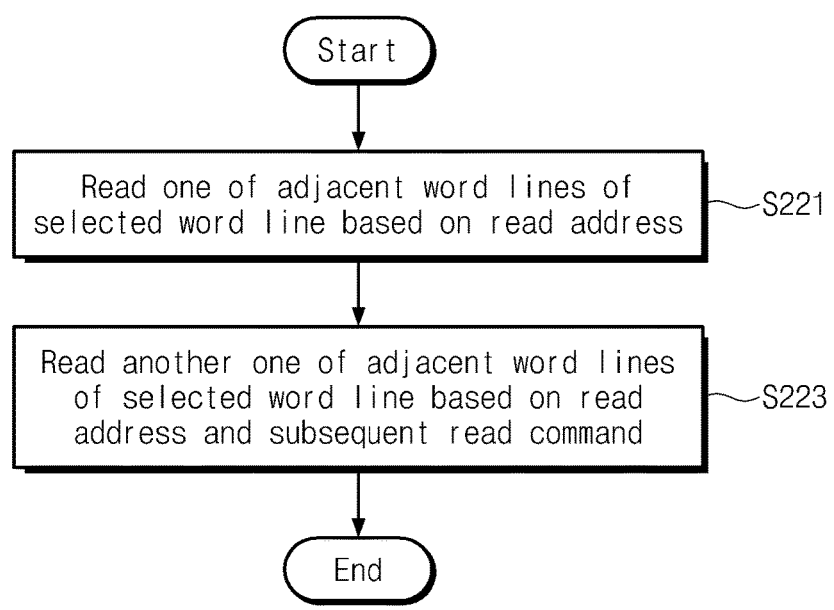
FIG. 9A is a flow chart illustrating a reliability verification read method according to another embodiment of the inventive concepts.

FIG. 9A is a flow chart illustrating a reliability verification read method according to another embodiment of the inventive concepts. Referring to FIGS. 1 and 9A, in operation S221, one of word lines adjacent to a selected word line may be read based on a read address. When a count value according to a read command issued by the memory controller 1200 equals or exceeds a random number, a memory controller 1200 may control a nonvolatile memory 1300 to read memory cells connected with one of word lines adjacent to the selected word line, selected based on the read address associated with the read command triggering the reliability verification read operation. For example, when the read address appoints a kth word line, the memory controller 1200 may generate an address corresponding to a (k−1)th word line or a (k+1)th word line. The memory controller 1200 may transfer the generated address and a read command to the nonvolatile memory 1300 to perform a reliability verification read operation.

In operation S223, the other one of the word lines adjacent to the selected word line may be read based on a read address. When a count value according to the read command equals or exceeds a random number, the memory controller 1200 may control the nonvolatile memory 1300 to read memory cells connected with the other one of the word lines adjacent to the selected word line, selected based on a read address associated with the read command triggering the reliability verification read operation. For example, when the input address appoints the kth word line, the memory controller 1200 may generate an address corresponding to a (k+1)th word line or a (k−1)th word line. The memory controller 1200 may transfer the generated address and a read command to the nonvolatile memory 1300 to perform the reliability verification read operation.

In example embodiments, the reliability verification read operation on the other word line may be performed in response to a following read command. If a first read command is issued and a count value equals or exceeds a random number, there may be performed the reliability verification read operation on one of word lines adjacent to a word line selected by a first read address associated with the first read command. After a second read command following the first read command is issued, there may be performed the reliability verification read operation on the other one of the word lines adjacent to the word line selected by the first read address.

In example embodiments, if the selected word line is located at an edge, that is, if an upper word line or a lower word line does not exist, one of the above-described operations S221 and S223 may be skipped.

Figure 9B:
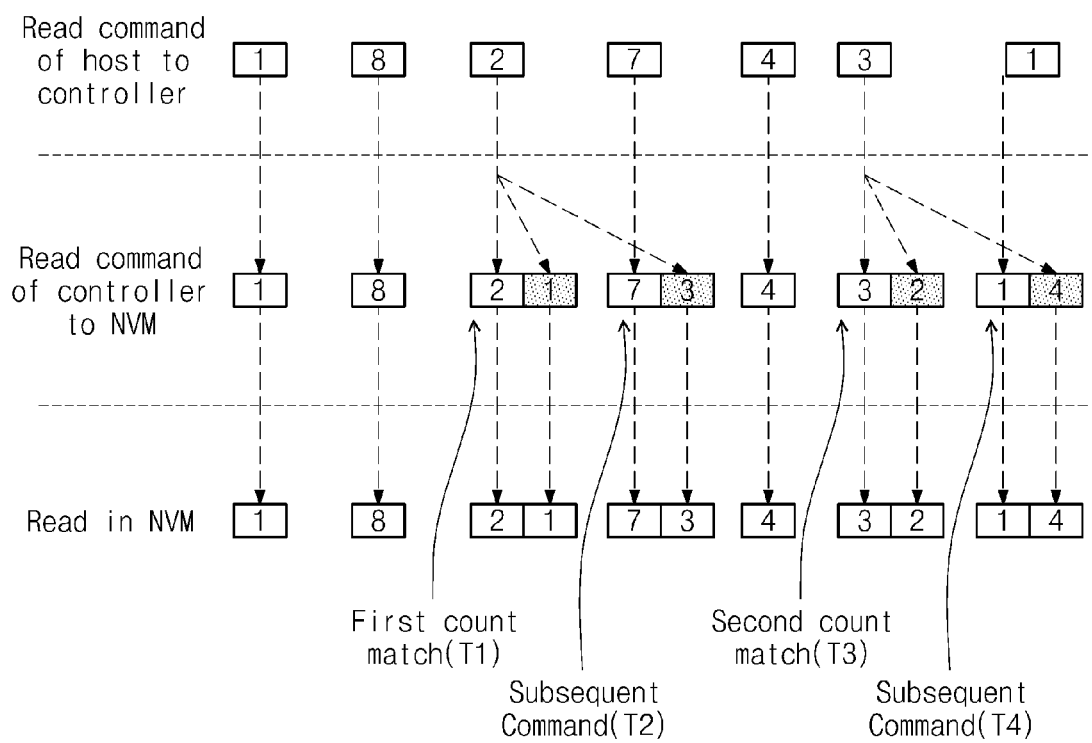
FIG. 9B is a diagram illustrating a reliability verification read operation according to a reliability verification read method of FIG. 9A.

FIG. 9B is a diagram illustrating a reliability verification read operation according to a reliability verification read method of FIG. 9A. Compared with FIG. 8B, if a count value equals or exceeds a random number at a first time T1, a memory controller 1200 may control a nonvolatile memory 1300 to sequentially perform a read operation on a selected word line 2 and a reliability verification read operation on one of word lines 1 and 3 adjacent to the selected word line 2. If a read command of a word line 7 is issued at a second time T2, the memory controller 1200 may control the nonvolatile memory 1300 to sequentially perform a read operation on a selected word line 7 and a reliability verification read operation on the other one of the word lines 1 and 3 adjacent to a word line 1 selected according to a previous read command.

Likewise, if a count value equals or exceeds (e.g., reaches) a random number at a third time T3, the memory controller 1200 may control the nonvolatile memory 1300 to sequentially perform a read operation on a selected word line 3 and a reliability verification read operation on one of word lines 2 and 4 adjacent to the selected word line 3. If a read command of a word line 1 is issued at a fourth time T4, the memory controller 1200 may control the nonvolatile memory 1300 to sequentially perform a read operation on a selected word line 1 and a reliability verification read operation on the other one of the word lines 2 and 4 adjacent to a word line 3 selected according to a previous read command.

FIG. 9B shows the example where the (k−1)th word line is read after the selected kth word line, and then the (k+1)th word line is read after the next selected word line. However, instead, the (k−1)th word line may be read after the selected kth word line, and then the (k−1)th word line may be read after the next select word line.

In a memory system including the memory controller 1200 and the nonvolatile memory 1300, if the reliability verification read operations are distributed to be performed responsive to a plurality of read commands, a response time to a read request of the host 1100 may be shortened.

In example embodiments, as described with reference to FIGS. 8B and 8C, an order of a read operation and a reliability verification read operation may be changed.

In example embodiments, as described with reference to FIGS. 8D and 8E, a location of a word line for a first reliability verification read operation and a location of a word line for a second reliability verification read operation may be changed.

Figure 10A:
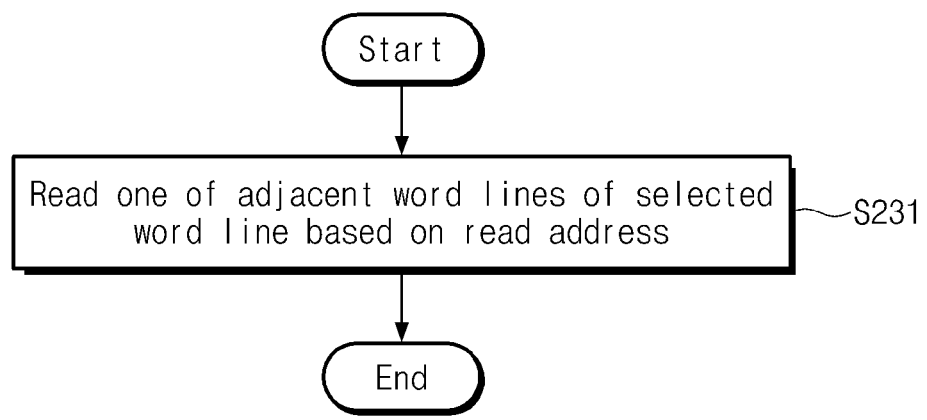
FIG. 10A is a flow chart illustrating a reliability verification read method according to still another embodiment of the inventive concepts.

FIG. 10A is a flow chart illustrating a reliability verification read method according to still another embodiment of the inventive concepts. Referring to FIGS. 1 and 10A, in operation S231, one of word lines adjacent to a selected word line may be read based on a read address. When a count value according to a read command issued by the memory controller 1200 equals or exceeds a random number, the memory controller 1200 may control the nonvolatile memory 1300 to read memory cells connected with one of the word lines adjacent to the selected word line, selected based on a read address associated with the read command issued by the memory controller 1200. For example, when the issued address appoints a kth word line, the memory controller 1200 may generate an address corresponding to a (k−1)th word line or a (k+1)th word line for reliability verification reading. The memory controller 1200 may transfer the generated address and a read command to the nonvolatile memory 1300 to perform a reliability verification read operation.

In example embodiments, a word line for the reliability verification read operation may be randomly selected from word lines adjacent to a selected word line. In the memory controller 1200, a random number generator 1220 may further generate a random number for selecting a dummy word line, and a word line for the reliability verification read operation may be selected from word adjacent lines based on the random number generated.

In example embodiments, word lines adjacent to a selected word line may be selected in turn for the reliability verification read operation. The memory controller 1200 may perform the reliability verification read operation on an upper (or, lower) word line at a first reliability verification read operation, and may perform the reliability verification read operation on a lower (or, upper) word line at a second reliability verification read operation.

Figure 10B:
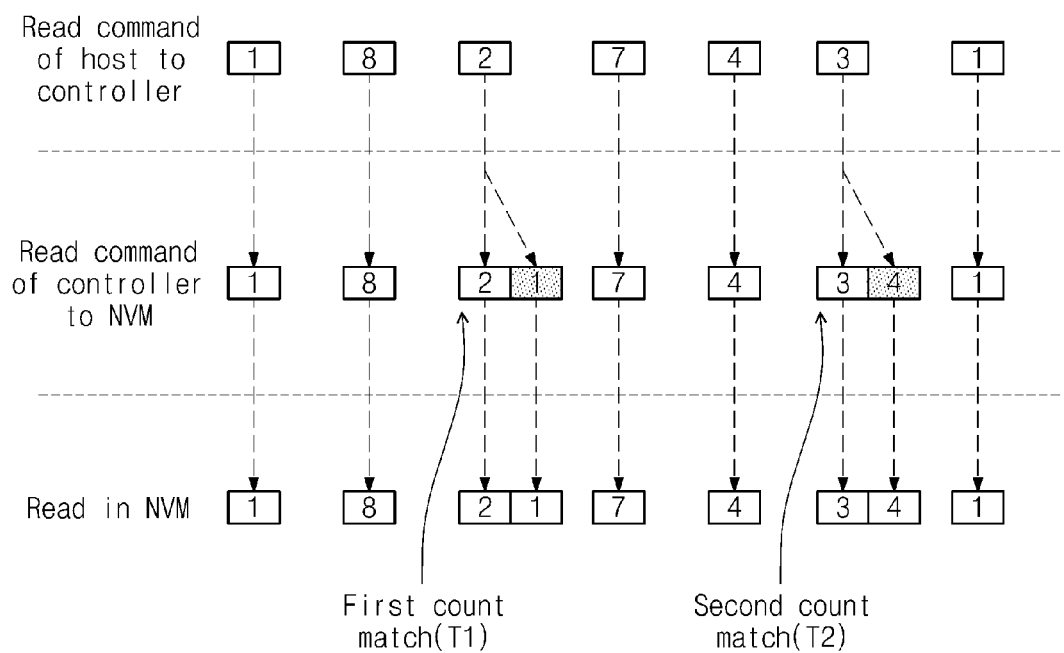
FIG. 10B is a diagram illustrating a reliability verification read operation according to a reliability verification read method of FIG. 10A.

FIG. 10B is a diagram illustrating a reliability verification read operation according to a reliability verification read method of FIG. 10A. Compared with FIG. 8B, if a count value is greater than or equal to a random number at a first time T1, a memory controller 1200 may control a nonvolatile memory 1300 to perform a read operation on a selected word line 2 and then perform a reliability verification read operation on one of word lines 1 and 3 adjacent to the selected word line 2. A word line, the reliability verification read operation of which is to be performed, from among adjacent word lines 1 and 3 may be selected randomly or alternately.

If a count value is greater than or equal to a random number at a second time T2, the memory controller 1200 may control the nonvolatile memory 1300 to perform a read operation on a selected word line 3 and then perform a reliability verification read operation on one of word lines 2 and 4 adjacent to the selected word line 3. A word line, the reliability verification read operation of which is to be performed, from among adjacent word lines 2 and 4 may be selected randomly or alternately.

In example embodiments, as described with reference to FIGS. 8B and 8C, an order of a read operation and a reliability verification read operation may be changed.

An average value (a first average value) of a reliability verification read frequency when the reliability verification read operation on one of word lines adjacent to a selected word line is performed as described with reference to FIGS. 10A and 10B may be less than an average value (a second average value) of a reliability verification read frequency when the reliability verification read operations on word lines adjacent to a selected word line are performed as described with reference to FIGS. 8A to 9B. For example, the first average value may be half the second average value.

Figure 11A:
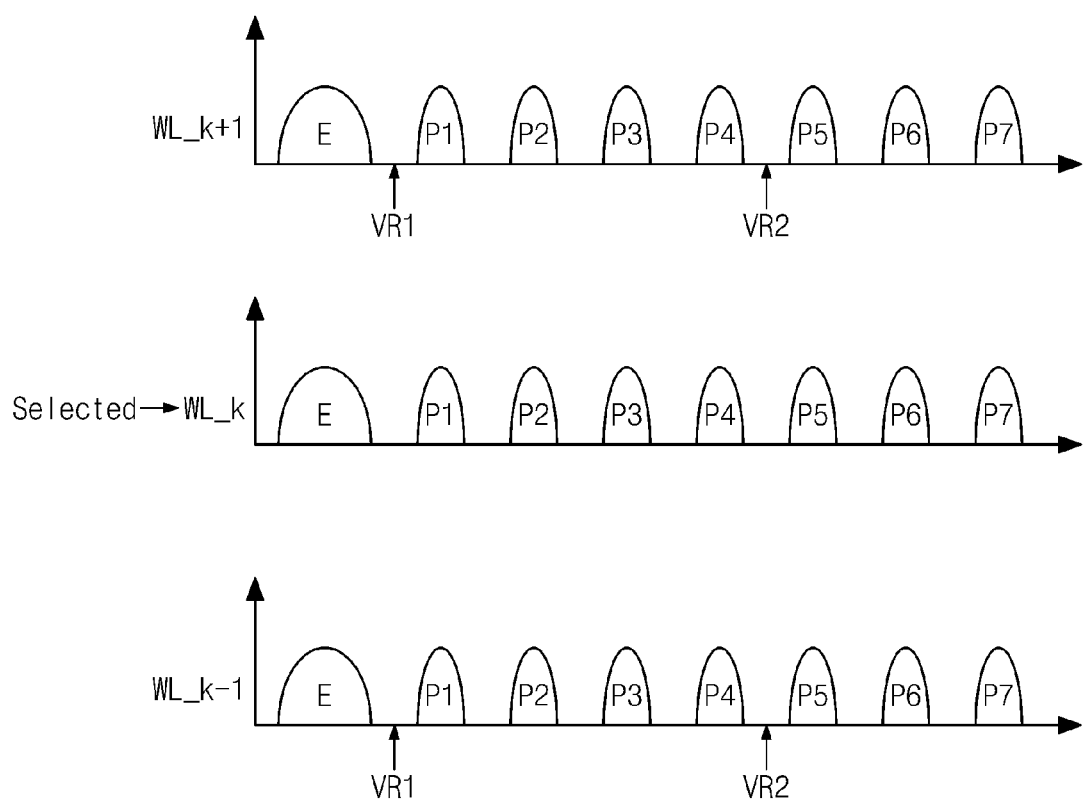
FIG. 11A shows an example of selection read voltages applied at a reliability verification read operation.

FIG. 11A shows an example of selection read voltages applied at a reliability verification read operation. In FIG. 11A, a horizontal axis may indicate a threshold voltage, and a vertical axis may indicate the number of memory cells. In FIG. 11A, there are illustrated threshold voltage distributions of memory cells connected with three word lines WL_k−1, WL_k, and WL_k+1.

Each of memory cells may have one of an erase state E and program states P1 to P7. That is, each memory cell may store 3-bit data. However, the inventive concepts are not limited thereto.

The word line WL_k may be a word line selected by a read command and a read address. The word lines WL_k−1 and WL_k+1 may be word lines adjacent to the selected word line. A plurality of voltages VR1 to VR2 may be applied to the word lines WL_k−1 and WL_k+1 as selection read voltages. The plurality of voltages VR1 to VR2 may be voltages used for a typical read operation.

For example, at a normal read operation, there may be used voltages for reading LSBs, voltages for reading CSBs, and voltages for reading MSBs. A reliability verification read operation may use read voltages, including a voltage having a level between the erase state E and a program state P1 proximate to the erase state E, from among the read voltages.

For example, the reliability verification read operation may be performed using a voltage VR1 proximate to the erase state E. Alternatively, the reliability verification read operation may be performed using read voltages VR1 and VR2 including the voltage VR1 proximate to the erase state E. For example, the reliability verification read operation may include an operation of reading a most significant bit (MSB). In example embodiments, in FIG. 11A, there is illustrated an example in which there are used voltages for reading the MSB. However, the inventive concepts are not limited thereto.

The erase state E may have a range of the lowest threshold voltage among states which memory cells have. Thus, read disturbance may be generated at memory cells having the erase state E. If the voltage VR1 between the erase state E and the program state P1 is used as a selection read voltage, read disturbance generated at the memory cells having the erase state E may be detected, and the strongest disturbance generated at adjacent word lines WL_k−1 and WL_k+1 may be detected.

Figure 11B:
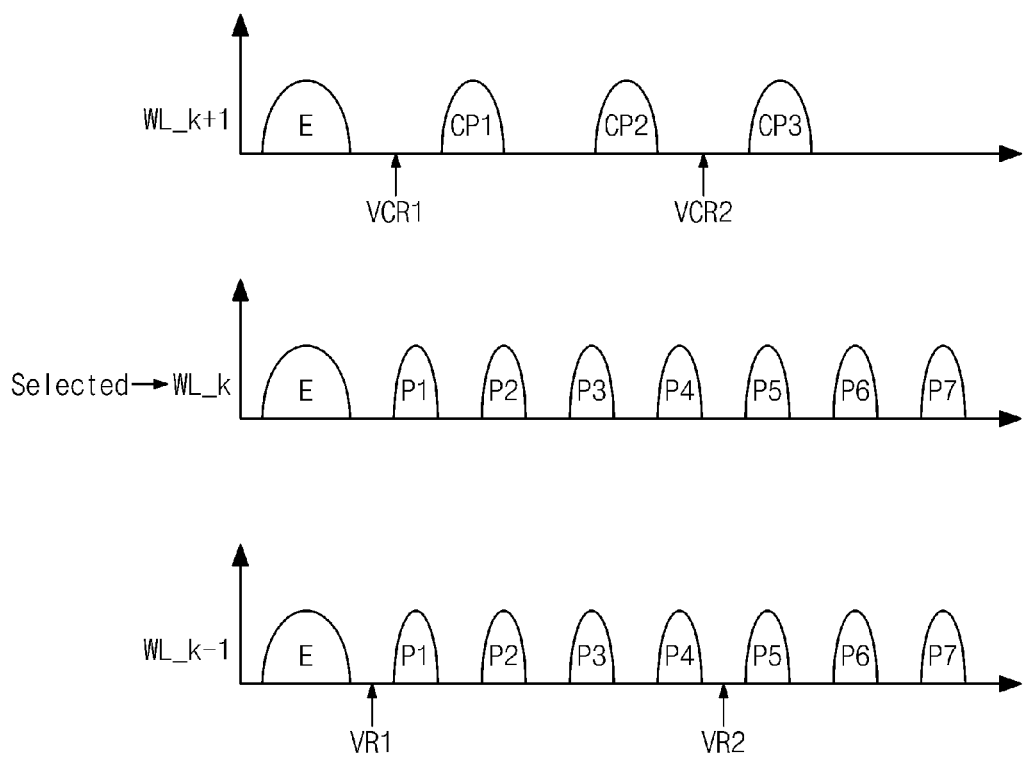
FIG. 11B shows another example of selection read voltages applied at a reliability verification read operation.

FIG. 11B shows another example of selection read voltages applied at a reliability verification read operation. Compared with FIG. 11A, memory cells of an adjacent word line WL_k+1 may store LSBs and CSBs. MSBs may not be stored at the memory cells of the adjacent word line WL_k+1. Memory cells of an adjacent word line WL_k−1 may store LSBs, CSBs, and MSBs. Memory cells of a selected word line WL_k may store LSBs, CSBs, and MSBs.

The memory cells of the adjacent word line WL_k−1 may be read as described with reference to FIG. 11A. When a reliability verification read operation on the adjacent word line WL_k+1 is performed, a plurality of voltages VCR1 and VRC2 may be used. The voltages VCR1 and VRC2 may be voltages used at a normal read operation. For example, at the normal read operation, there may be used voltages for reading LSBs and voltages for reading CSBs. The reliability verification read operation may be performed using read voltages, including a voltage having a level between an erase state E and a program state CP1 proximate to the erase state E, from among the voltages. For example, the reliability verification read operation may be performed using a voltage VR1 proximate to the erase state E. Alternatively, the reliability verification read operation may be performed using read voltages VCR1 and VCR2 including the voltage VCR1 proximate to the erase state E. For example, the reliability verification read operation may include an operation of reading the CSBs. In example embodiments, in FIG. 11B, there is illustrated an example in which voltages for reading the CSBs are used. However, the inventive concepts are not limited thereto.

Figure 11C:
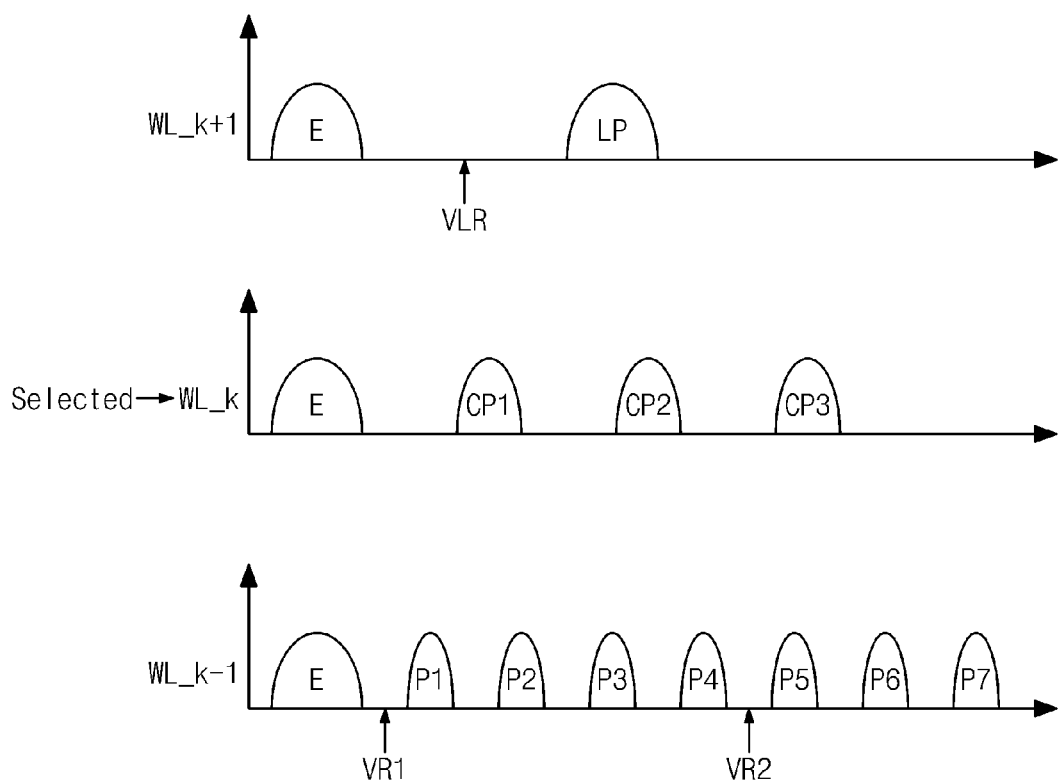
FIG. 11C shows still another example of selection read voltages applied at a reliability verification read operation.

FIG. 11C shows still another example of selection read voltages applied at a reliability verification read operation. Compared with FIG. 11A, memory cells of an adjacent word line WL_k+1 may store LSBs. CSBs and MSBs may not be stored at the memory cells of the adjacent word line WL_k+1. Memory cells of an adjacent word line WL_k−1 may store LSBs, CSBs, and MSBs. Memory cells of a selected word line WL_k may store LSBs and CSBs.

The memory cells of the adjacent word line WL_k−1 may be read as described with reference to FIG. 11A. When a reliability verification read operation on the adjacent word line WL_k+1 is performed, a voltage VLR may be used. The voltage VLR may be a voltage used at a normal read operation. For example, the voltage VLR may be a voltage for reading the LSB. The reliability verification read operation may be performed using a voltage VLR proximate to the erase state E. Alternatively, the reliability verification read operation may include an operation of reading the LSBs.

Figure 11D:
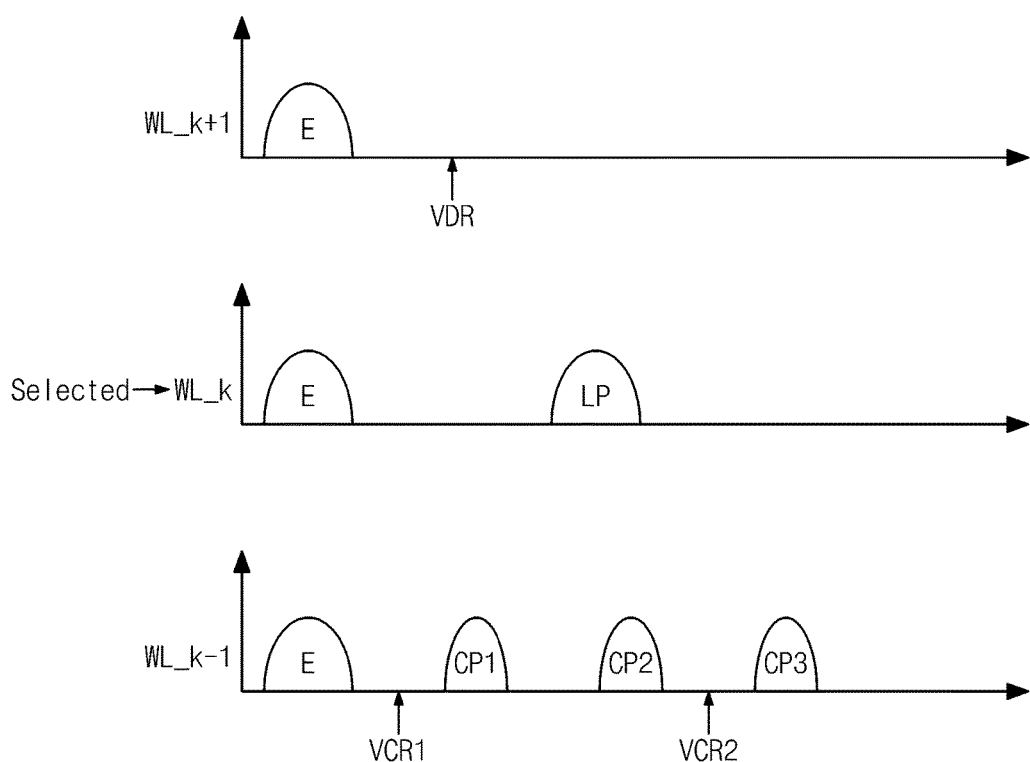
FIG. 11D shows still another example of selection read voltages applied at a reliability verification read operation.

FIG. 11D shows still another example of selection read voltages applied at a reliability verification read operation. Compared with FIG. 11B, memory cells of an adjacent word line WL_k+1 may have an erase state E. That is, data may not be stored at the memory cells of the adjacent word line WL_k+1. Memory cells of an adjacent word line WL_k−1 may store LSBs and CSBs. Memory cells of a selected word line WL_k may store LSBs.

The memory cells of the adjacent word line WL_k−1 may be read as described with reference to an adjacent word line WL+k+1 of FIG. 11B. When a reliability verification read operation on the adjacent word line WL_k+1 is performed, a reliability verification read voltage VDR may be used. The reliability verification read voltage VDR may be a voltage having a level between an erase state E and a program state P1 proximate to the erase state E. The reliability verification read voltage VDR may be a voltage used at a normal read operation. For example, the reliability verification read voltage VDR may be a voltage, having a level proximate to the erase state E, from among voltages for reading LSBs, voltages for reading CSBs, and voltages for reading MSBs. The reliability verification read voltage VDR may be a voltage which has a level different from voltages used at a normal read operation and has a desired (or, alternatively a predetermined) level for the reliability verification read operation.

Figure 11E:
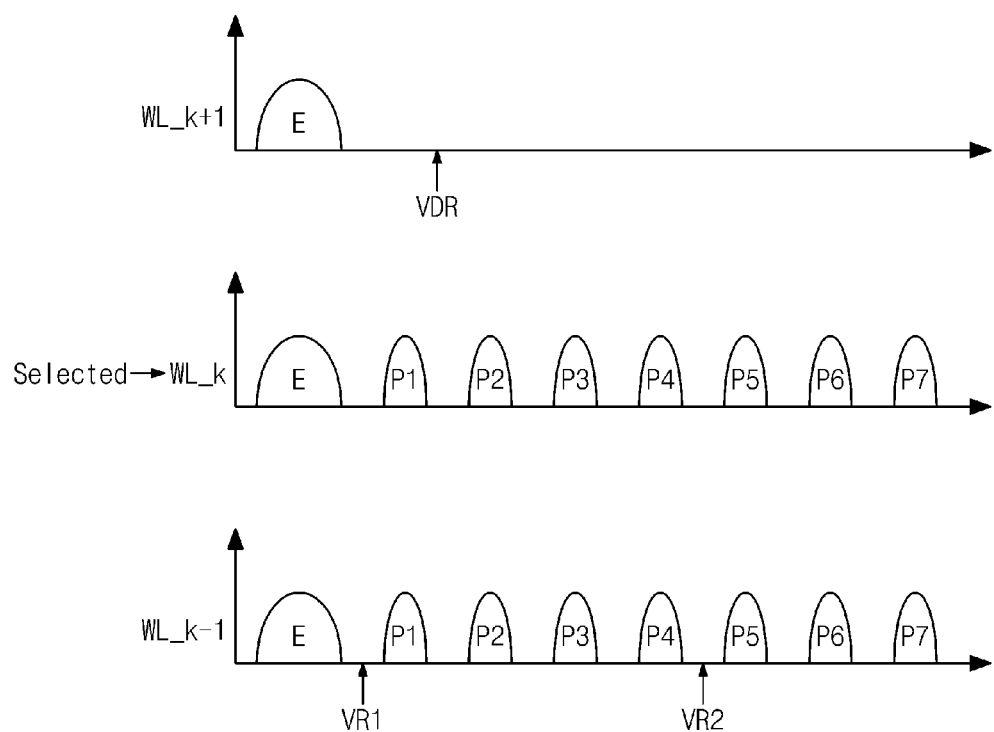
FIG. 11E shows still another example of selection read voltages applied at a reliability verification read operation.

FIG. 11E shows still another example of selection read voltages applied at a reliability verification read operation. Compared with FIG. 11A, memory cells of an adjacent word line WL_k+1 may have an erase state E. That is, data may not be stored at the memory cells of the adjacent word line WL_k+1. Memory cells of an adjacent word line WL_k−1 may store LSBs, CSBs, and MSBs. Memory cells of a selected word line WL_k may store LSBs, CSBs, and MSBs.

The memory cells of the adjacent word line WL_k−1 may be read as described with reference to FIG. 11A. The memory cells of the adjacent word line WL_k+1 may be read as described with reference to an adjacent word line WL+k+1 of FIG. 11D.

Figure 11F:
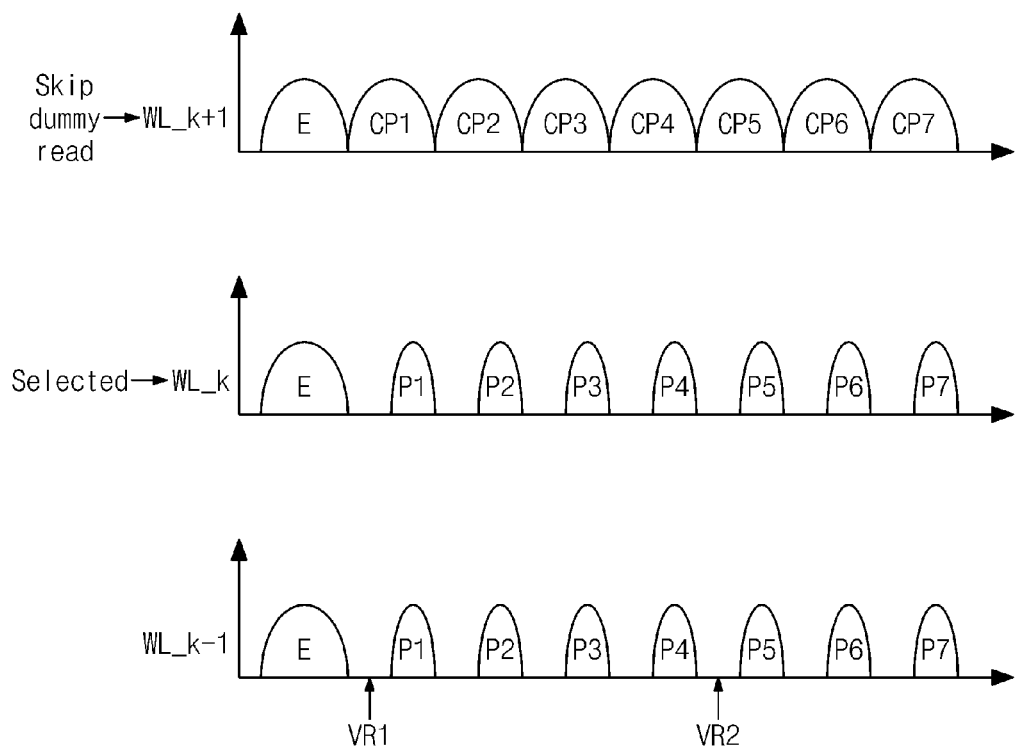
FIG. 11F shows still another example of selection read voltages applied at a reliability verification read operation.

FIG. 11F shows still another example of selection read voltages applied at a reliability verification read operation. Compared with FIG. 11A, memory cells of an adjacent word line WL_k+1 may store LSBs, CSBs, and MSBs. Memory cells of an adjacent word line WL_k−1 may store LSBs, CSBs, and MSBs. Memory cells of a selected word line WL_k may store LSBs, CSBs, and MSBs.

The memory cells of the adjacent word line WL_k−1 may be read as described with reference to FIG. 11A. When a reliability verification read operation is performed, a read operation on the adjacent word line WL_k+1 coarse-programmed may be skipped if course programmed.

Coarse programming may be a program sequence of on-chip buffered programming. The on-chip buffered programming may be programming in which 1-step programming, coarse programming and fine programming are performed with respect to memory cells of a word line. At the 1-step programming, at least two bits of LSB, CSB and MSB may be programmed at each memory cell in a selected word line. At the coarse programming, LSB, CSB and MSB may be programmed at each memory cell in the selected word line. The fine programming may be performed to finely program coarse-programmed memory cells at which LSB, CSB and MSB are programmed. Reading memory cells having experienced both the 1-step programming and the coarse programming may not be performed. Reading memory cells having experienced all of the 1-step programming, the coarse programming and the fine programming may be performed.

FIG. 12 is a diagram illustrating a method in which a memory controller 1200 manages a random number and a count value. Referring to FIG. 12, a memory controller 1200 may perform one of total management, block group management, and block management.

The total management may manage a random number RDN and a read count with respect to the whole storage space of the nonvolatile memory 1300. A random number generator 1220 may generate a random number RDN. A counter 1230 may count a count value. A count value may increase when the memory controller 1200 issues a read command or the nonvolatile memory 1300 performs a read operation. The count value may be compared with the random number.

The block group management may manage memory blocks of the nonvolatile memory 1300 by block group. Each block group may include a plurality of memory blocks. The random number generator 1220 may generate random numbers RDN1 to RDNn respectively corresponding to the block groups. The counter 1230 may count a plurality of count values respectively corresponding to the block groups. The memory controller 1200 may mange random numbers and count values by the block group. A count value corresponding to a block group of a read target may increase when the memory controller 1200 issues a read command or the nonvolatile memory 1300 performs a read operation. The increased count value may be compared with a random number corresponding to the block group of the read target.

The block management may manage a plurality of memory blocks of the nonvolatile memory 1300. The random number generator 1220 may generate random numbers RDN1 to RDNn respectively corresponding to the memory blocks. The counter 1230 may count a plurality of count values respectively corresponding to the memory blocks. The memory controller 1200 may mange random numbers and count values by the block. A count value corresponding to a memory block of a read target may increase when the memory controller 1200 issues a read command or the nonvolatile memory 1300 performs a read operation. The count value increased may be compared with a random number corresponding to the memory block of the read target.

Figure 13A:
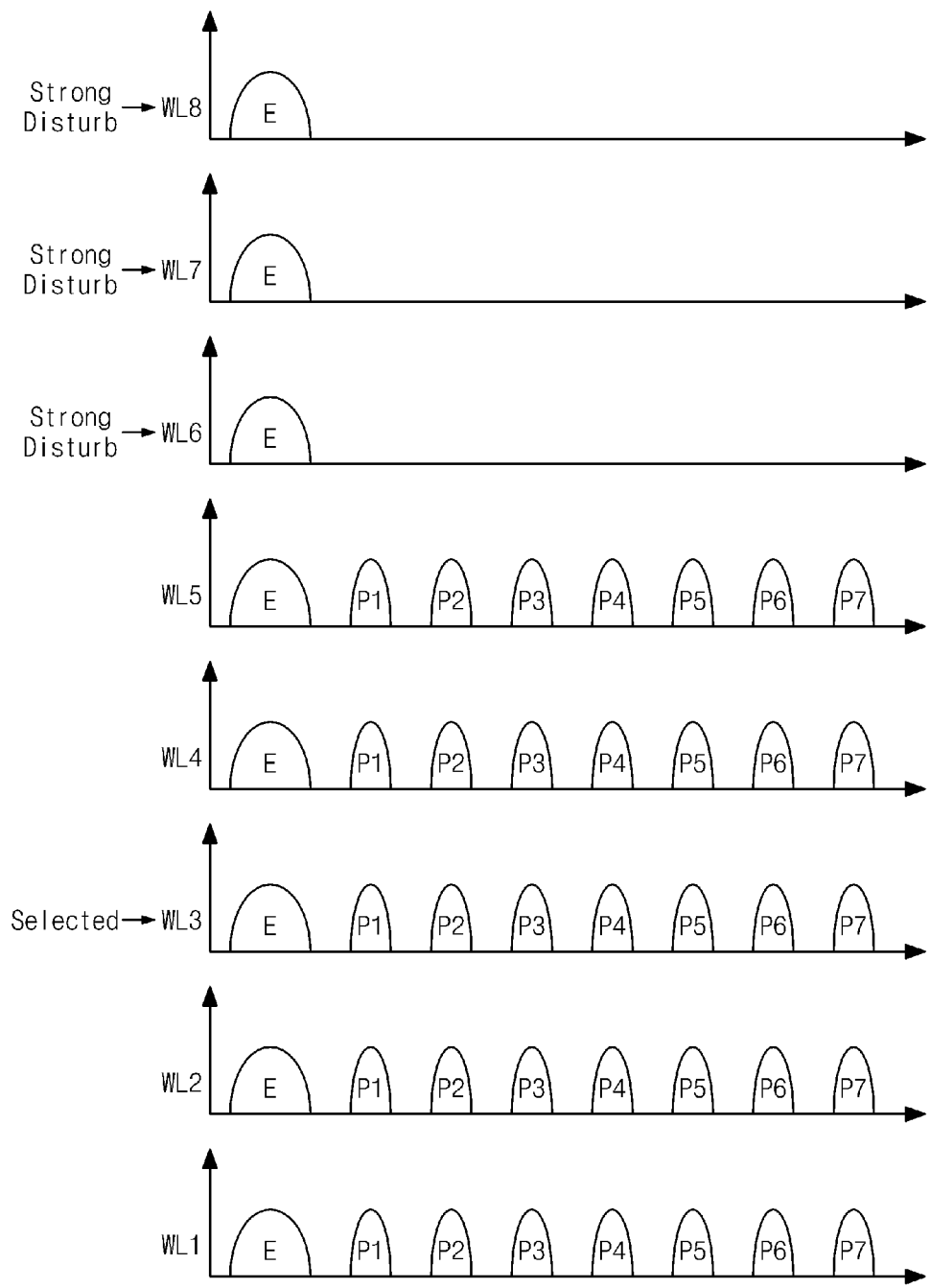
FIG. 13A shows an example situation where disturbance may be generated at an open word line of a nonvolatile memory.

FIG. 13A shows an example situation where disturbance may be generated at an open word line of a nonvolatile memory. In FIG. 13A, a horizontal axis may indicate a threshold voltage, and a vertical axis may indicate the number of memory cells. That is, in FIG. 13A, there are illustrated threshold voltage distributions of memory cells connected with word lines WL1 to WL8.

Referring to FIG. 13A, LSBs, CSBs, and MSBs may be stored at memory cells connected with the word lines WL1 to WL5. Data may not be stored at memory cells connected with the word lines WL6 to WL8. The word lines WL6 to WL8 connected with the memory cells at which data is not stored may be open word lines. Namely, the memory cells of an open word line have an erased state.

A read operation on a selected word line WL3 may be performed. Although disturbance is generated at the word lines WL1, WL2, WL4, and WL5, the strongest disturbance may be generated at the word lines WL6 and WL7 connected with memory cells each having an erase state E (i.e., open word lines). The disturbance generated at the word lines WL6 and WL7 may be stronger than that generated at the word lines WL2 and WL4 adjacent to the selected word line WL3.

Figure 13B:
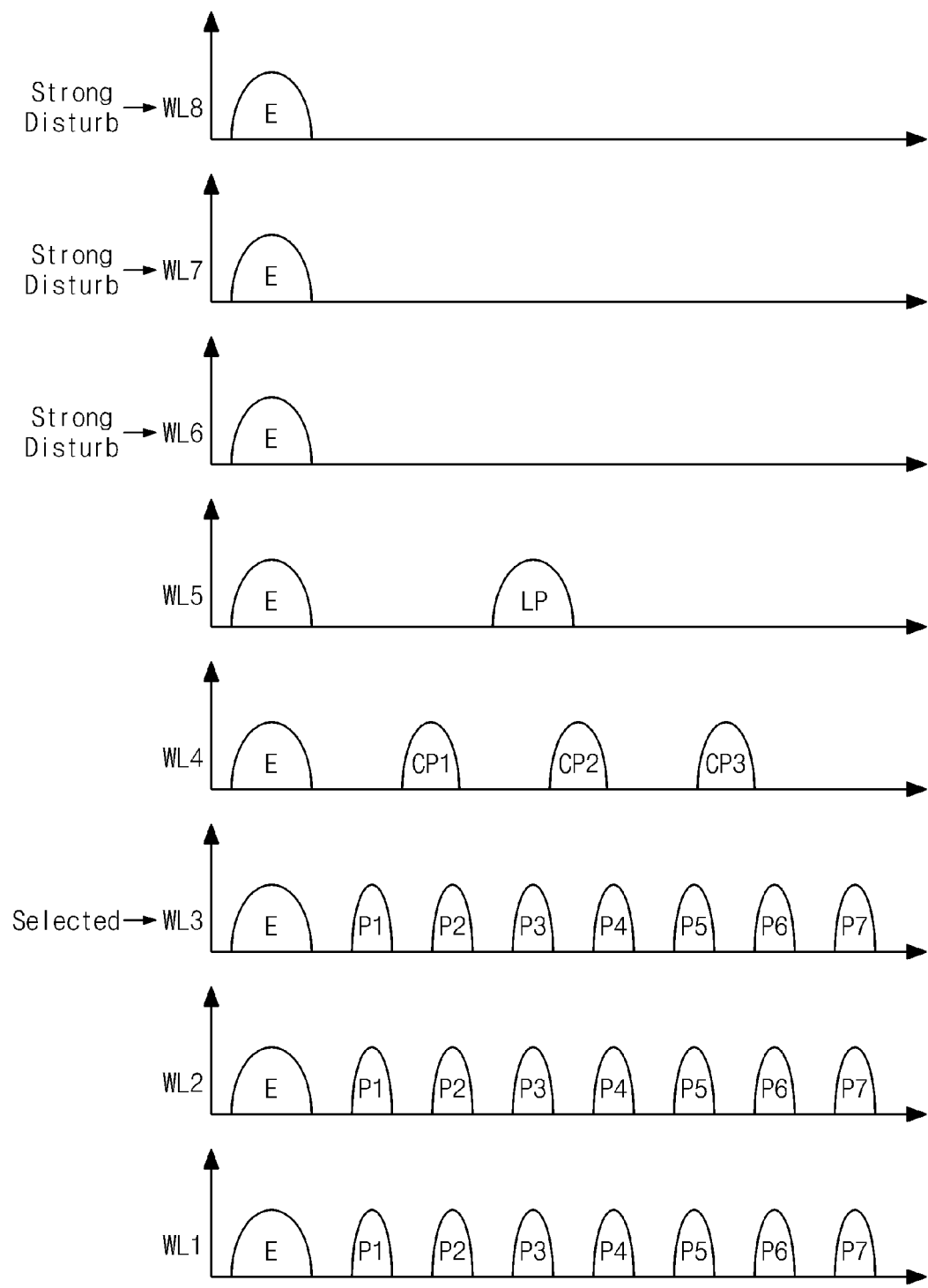
FIG. 13B shows another example situation where disturbance may be generated at an open word line of a nonvolatile memory.

FIG. 13B shows another example situation where disturbance may be generated at an open word line of a nonvolatile memory. In FIG. 13B, a horizontal axis may indicate a threshold voltage, and a vertical axis may indicate the number of memory cells. That is, in FIG. 13B, there are illustrated threshold voltage distributions of memory cells connected with word lines WL1 to WL8.

Referring to FIG. 13B, LSBs, CSBs, and MSBs may be stored at memory cells connected with the word lines WL1 to WL3. LSBs and CSBs may be stored at memory cells connected with the word line WL4. LSBs may be stored at memory cells connected with the word line WL5. The word lines WL6 to WL8 connected with the memory cells at which data is not stored may be open word lines.

A read operation on a selected word line WL3 may be performed. Although disturbance is generated at the word lines WL1, WL2, WL4, and WL5, the strongest disturbance may be generated at the word lines WL6 to WL8 connected with memory cells each having an erase state E. The disturbance generated at the word lines WL6 to WL8 may be stronger than that generated at the word lines WL2 and WL4 adjacent to the selected word line WL3.

Figure 13C:
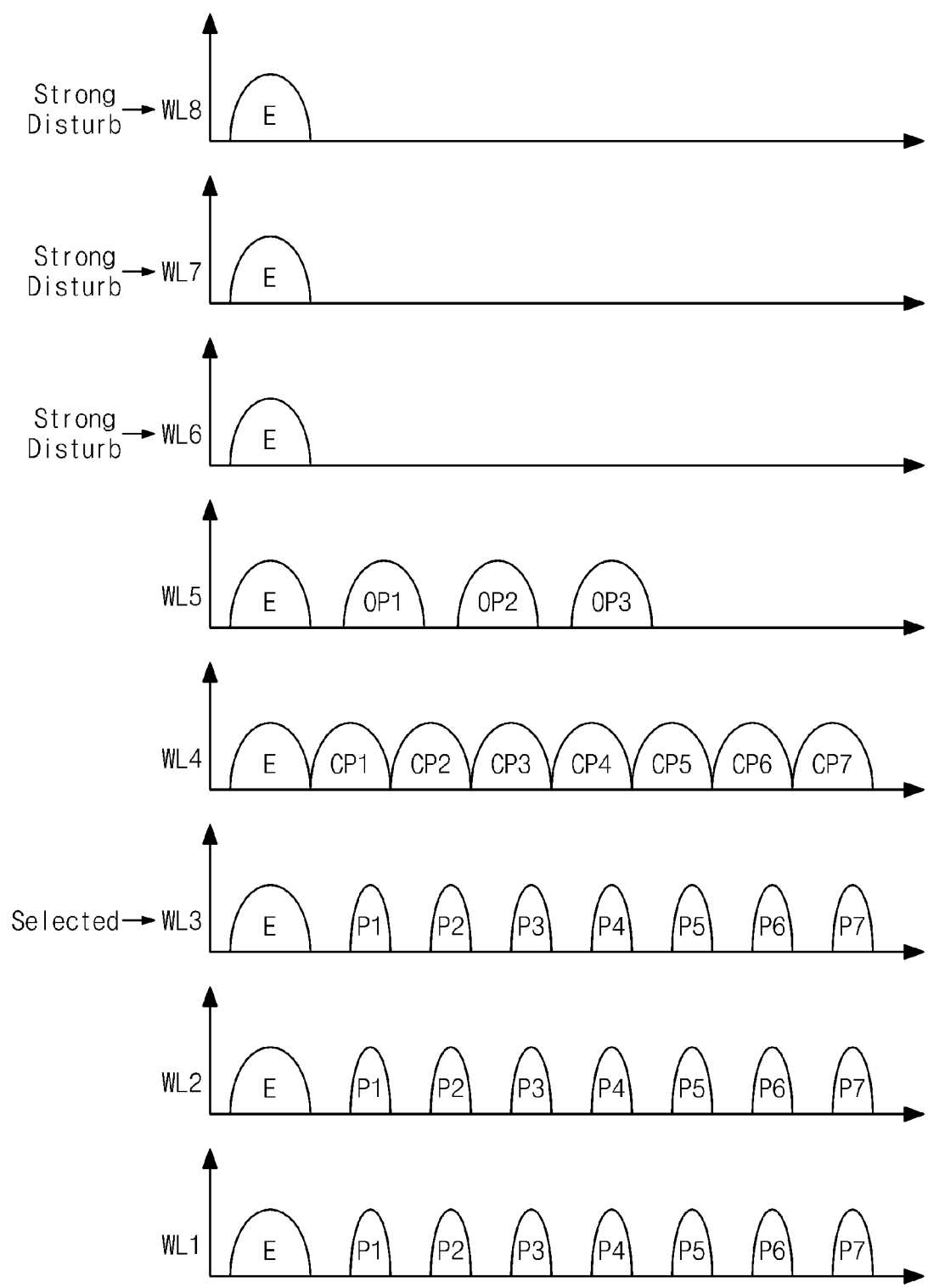
FIG. 13C shows another example situation where disturbance may be generated at an open word line of a nonvolatile memory.

FIG. 13C shows another example situation where disturbance may be generated at an open word line of a nonvolatile memory. In FIG. 13C, a horizontal axis may indicate a threshold voltage, and a vertical axis may indicate the number of memory cells. That is, in FIG. 13C, there are illustrated threshold voltage distributions of memory cells connected with word lines WL1 to WL8.

Referring to FIG. 13C, LSBs, CSBs, and MSBs may be stored at memory cells connected with the word lines WL1 to WL3. Memory cells connected with the word line WL4 may be coarse programmed. Memory cells connected with the word line WL5 may be 1-step programmed. The word lines WL6 to WL8 connected with the memory cells at which data is not stored may be open word lines.

A read operation on a selected word line WL3 may be performed. Although disturbance is generated at the word lines WL1, WL2, WL4, and WL5, the strongest disturbance may be generated at the word lines WL6 to WL8 connected with memory cells each having an erase state E. The disturbance generated at the word lines WL6 to WL8 may be stronger than that generated at the word lines WL2 and WL4 adjacent to the selected word line WL3.

As described with reference to FIGS. 13A to 13C, when a memory block to be read includes open word lines, the strongest disturbance may be generated at the open word lines. To prevent this problem, a reliability verification read operation according to an embodiment of the inventive concepts may be performed with respect to the open word lines.

Figure 14A:
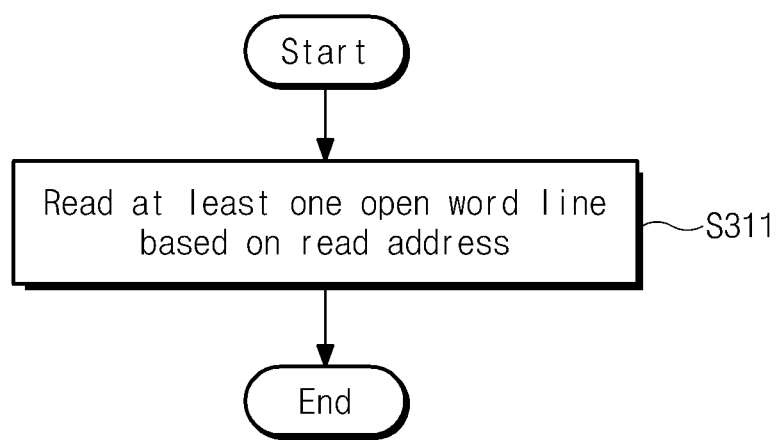
FIG. 14A is a flow chart of a reliability verification read method according to still another embodiment of the inventive concepts.

FIG. 14A is a flow chart of a reliability verification read method according to still another embodiment of the inventive concepts. Referring to FIGS. 1 and 14A, in operation S311, at least one open word line may be read based on a read address associated with a read command issued by the memory controller 1200. When a count value received from a counter 1230 reaches (e.g., equals or exceeds) a random number received from a random number generator 1220, a memory controller 1200 may perform a reliability verification read operation on an open word line of a memory block corresponding to the read address.

Figure 14B:
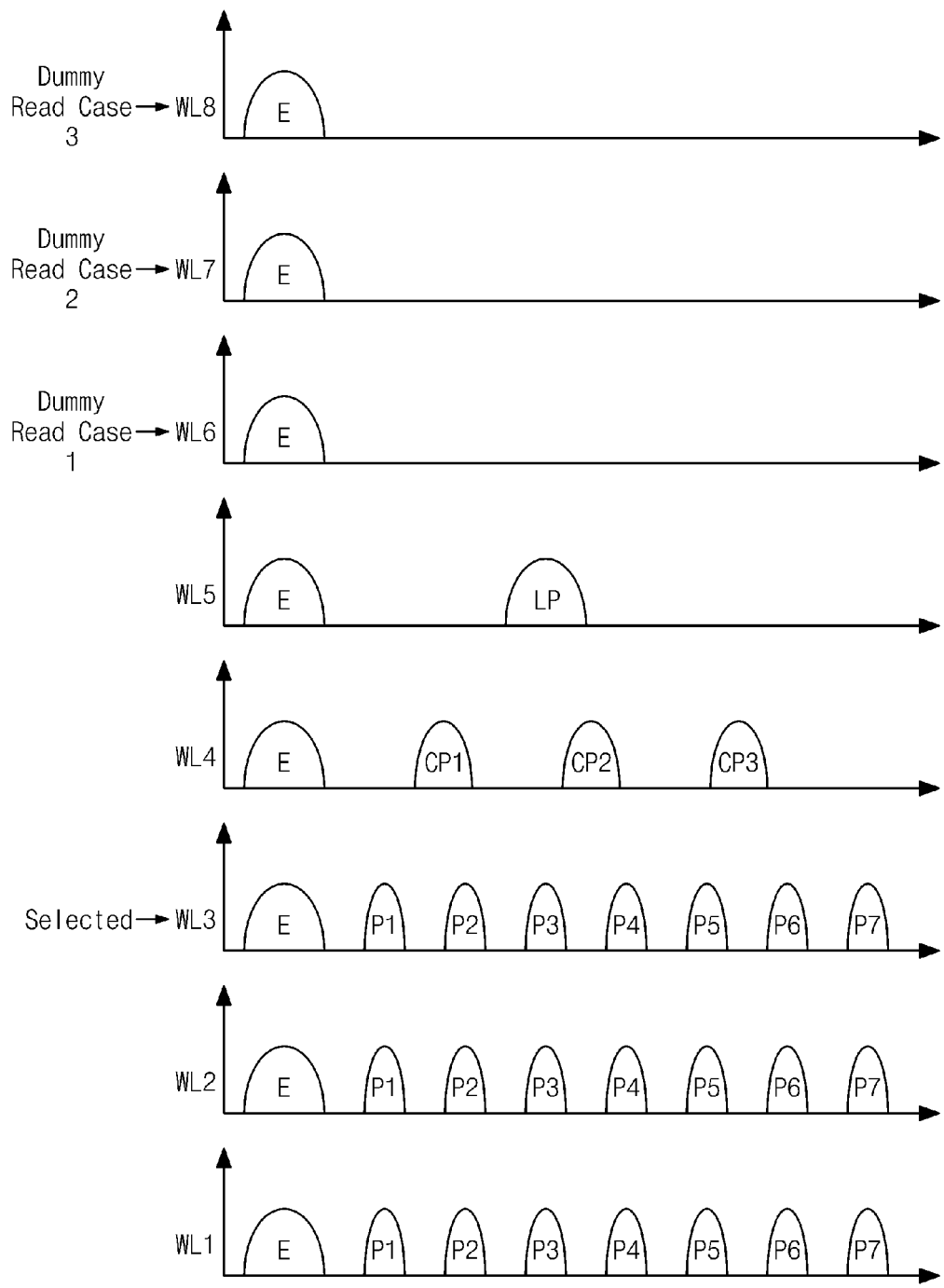
FIG. 14B shows an example of a reliability verification read operation according to a reliability verification read method of FIG. 14A.

FIG. 14B shows an example of a reliability verification read operation according to a reliability verification read method of FIG. 14A. Referring to FIGS. 1 and 14B, word lines WL6 to WL8 in a memory block including a selected word line WL3 may be open word lines. A reliability verification read operation may be performed with respect to an open word line at a desired (or, alternatively a predetermined) location.

For example, referring to a first reliability verification read case, the reliability verification read operation may be performed with respect to one WL6, proximate to word lines WL1 to WL5 programmed, from among open word lines.

Referring to a second reliability verification read case, the reliability verification read operation may be performed with respect to a word line WL7, located at the center, from among open word lines.

Referring to a third reliability verification read case, the reliability verification read operation may be performed with respect to a word line WL8, farthest from the word lines WL1 to WL5 programmed, from among open word lines.

In example embodiments, the reliability verification read on an open word line may be performed according to a program sequence described with reference to FIG. 8B to 8E, 9B, or 10B.

In example embodiments, the reliability verification read on an open word line may be performed using a voltage described with reference to the reliability verification read operation on an adjacent word line WL_k+1 of FIG. 11D or 11E.

FIG. 15 is a diagram illustrating another method in which a memory controller 1200 manages a random number and a count value. Referring to FIG. 15, a memory controller 1200 may perform one of total management, block group management, and block management.

The total management may manage a first reliability verification read table and a second reliability verification read table with respect to the whole storage space of a nonvolatile memory 1300. The first reliability verification read table may be a table for performing a reliability verification read operation on an adjacent word line. The second reliability verification read table may be a table for performing a reliability verification read operation on an open word line.

A memory controller 1200 may also manage a random number RDN_C and a read count using the first reliability verification read table. A random number generator 1220 may generate a random number corresponding to the first reliability verification read table. A counter 1230 may count a count value corresponding to the first reliability verification read table. The count value may be compared with the random number RDN_C.

The memory controller 1200 may manage a random number RDN_O and a read count using the second reliability verification read table. The random number generator 1220 may generate a random number RDN_O corresponding to the second reliability verification read table. The counter 1230 may count a count value corresponding to the second reliability verification read table. The count value may be compared with the random number RDN_O.

The first and second reliability verification read tables may be managed independently. For example, when a read operation is performed at a memory block, not including an open word line, from among memory blocks of a nonvolatile memory 1300, a count value of the first reliability verification read table is increased, while a count value of the second reliability verification read table is not increased. When a read operation is performed at a memory block including an open word line, a count value of the first reliability verification read table and a count value of the second reliability verification read table are increased.

When the reliability verification read operations on adjacent word lines are performed based on the first reliability verification read table, information of the second reliability verification read table may not be changed. For example, although a random number of the first reliability verification read table is again generated and a count value is reset, the random number and the count value of the second reliability verification read table may be retained. Likewise, when the reliability verification read operation on at least one open word line is performed based on the second reliability verification read table, information of the first reliability verification read table may not be changed. For example, although a random number of the second reliability verification read table is again generated and a count value is reset, the random number and the count value of the first reliability verification read table may be retained.

The block group management may manage memory blocks of the nonvolatile memory 1300 by the block group. Each block group may include a plurality of memory blocks. The block group management may manage a first reliability verification read table and a second reliability verification read table with respect to block groups.

The memory controller 1200 may manage a plurality of random numbers RDN_C1 to RDN_Cn and read counts corresponding to block groups, respectively, using the first reliability verification read table. The random number generator 1220 may generate the random numbers RDN_C1 to RDN_Cn corresponding to block groups of the first reliability verification read table, respectively. The counter 1230 may count a plurality of count value corresponding to block groups of the first reliability verification read table, respectively. When a read operation of the nonvolatile memory 1300 is performed, a count value corresponding to a block group of a read target may increase. The count value may be compared with a random number corresponding to the block group of the read target.

The memory controller 1200 may also manage a plurality of random numbers RDN_O1 to RDN_On and read counts corresponding to block groups, respectively, using the second reliability verification read table. The random number generator 1220 may generate the random numbers RDN_O1 to RDN_On corresponding to block groups of the second reliability verification read table, respectively. The counter 1230 may count a plurality of count value corresponding to block groups of the second reliability verification read table, respectively. When a read operation of the nonvolatile memory 1300 is performed, a count value corresponding to a block group of a read target may increase. The count value may be compared with a random number corresponding to the block group of the read target.

The first and second reliability verification read tables may be managed independently.

The block management may manage a plurality of memory blocks of the nonvolatile memory 1300. The memory controller 1200 may manage first and second reliability verification read tables with respect to memory blocks of the nonvolatile memory 1300.

The memory controller 1200 may manage a plurality of random numbers RDN_C1 to RDN_Cn and read counts corresponding to memory blocks, respectively, using the first reliability verification read table. The random number generator 1220 may generate the random numbers RDN_C1 to RDN_Cn corresponding to memory blocks of the first reliability verification read table, respectively. The counter 1230 may count a plurality of count value corresponding to memory blocks of the first reliability verification read table, respectively. When a read operation of the nonvolatile memory 1300 is performed, a count value corresponding to a memory block of a read target may increase. The count value may be compared with a random number corresponding to the memory block of the read target.

The memory controller 1200 may manage a plurality of random numbers RDN_O1 to RDN_On and read counts corresponding to memory blocks, respectively, using the second reliability verification read table. The random number generator 1220 may generate the random numbers RDN_O1 to RDN_On corresponding to memory blocks of the second reliability verification read table, respectively. The counter 1230 may count a plurality of count value corresponding to memory blocks of the second reliability verification read table, respectively. When a read operation of the nonvolatile memory 1300 is performed, a count value corresponding to a memory block of a read target may increase. The count value may be compared with a random number corresponding to the memory block of the read target.

The first and second reliability verification read tables may be managed independently.

In FIG. 15, there is described an example in which information for performing the reliability verification read operations on adjacent word lines and information for performing the reliability verification read operation on an open word line are managed independently. However, as illustrated with reference to FIG. 12, information for performing the reliability verification read operations on adjacent word lines and information for performing the reliability verification read operation on an open word line may be managed in common.

For example, when a count value reaches a random number, the reliability verification read operation may be performed with respect to word lines adjacent to a selected word line. When an open word line exists at a memory block including the selected word line, the reliability verification read operation may be additionally performed with respect to the open word line.

For example, when a count value reaches a random number, whether an open word line exists at a memory block including the selected word line may be determined. If an open word line does not exist at a memory block including the selected word line, the reliability verification read operation may be performed with respect to word lines adjacent to the selected word line. If an open word line exists at a memory block including the selected word line, the reliability verification read operation may be performed with respect to the open word line. As described with reference to FIGS. 11D and 11E, for example, at least one of word lines adjacent to a selected word line may be an open word line. At this time, the reliability verification read operation may be performed with respect to the adjacent word lines, while an additional reliability verification read operation on another open word line may be skipped.

In example embodiments, when a condition for the reliability verification read operation on adjacent word lines and a condition for the reliability verification read operation on an open word line are satisfied at the same time, as described with reference to FIG. 9B, the reliability verification read operations on the adjacent word lines and the reliability verification read operation on the open word line may be distributed to subsequent read commands.

Figure 16:
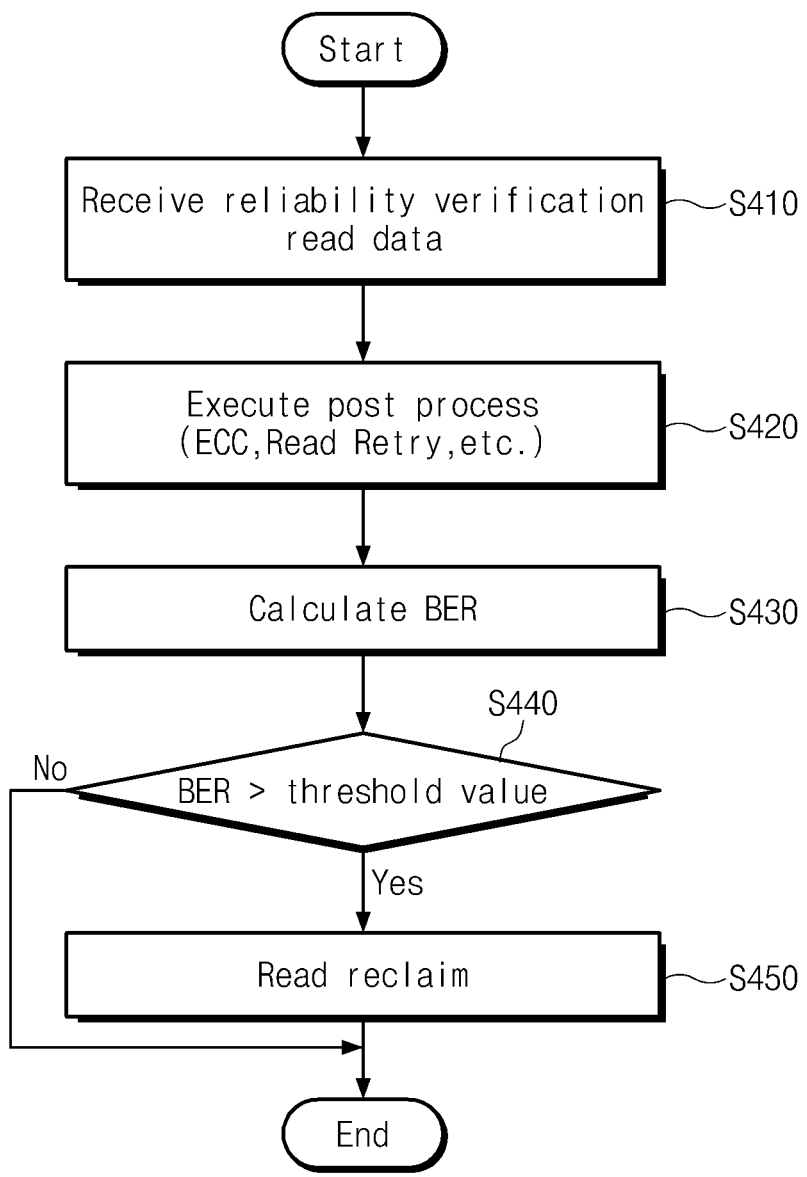
FIG. 16 is a flow chart illustrating an example of a following operation executed after a reliability verification read operation.

FIG. 16 is a flow chart illustrating an example of a subsequent operation executed after a reliability verification read operation. In FIG. 16, there is illustrated a post process when the reliability verification read operation on a word line storing data is performed.

Referring to FIGS. 1 and 16, in operation S410, reliability verification read data may be received. The memory controller 1200 may receive data read from a nonvolatile memory 1300 for reliability verification.

In operation S420, a preliminary post process may be executed by the memory controller 1200. For example, processes such as error correction, read retry, etc. may be performed. The read retry may be a process in which when error correction has failed, a read operation is again performed over changing read conditions such as a level of a read voltage.

In operation S430, a bit error rate BER may be calculated. The bit error rate BER may be calculated according to an error correction result of an error correction unit 1250 of the memory controller 1200.

In operation S440, whether the BER is larger than a threshold value may be determined. If not larger, the post operation of the reliability verification read operation may end. If larger, in operation S450, read reclaim may be executed by the memory controller 1200 as the post process of the reliability verification read operation.

The read reclaim may be an operation in which data is read from memory cells and the read data is written at other memory cells of the nonvolatile memory 1300. For example, the memory controller 1200 may read data from memory cells of a word line being a reliability verification read target and write the read data at another memory block of the nonvolatile memory 1300. The memory controller 1200 may read data from a memory block including a word line being a reliability verification read target and write the read data at memory cells of another memory block of the nonvolatile memory 1300.

If the read reclaim is performed, cumulative disturbance of memory cells may be removed.

In example embodiments, when the BER is not larger than the threshold value, the read reclaim may not be performed. However, cumulative disturbance of the open word line may be separately checked through the reliability verification read operation on the open word line.

Figure 17:
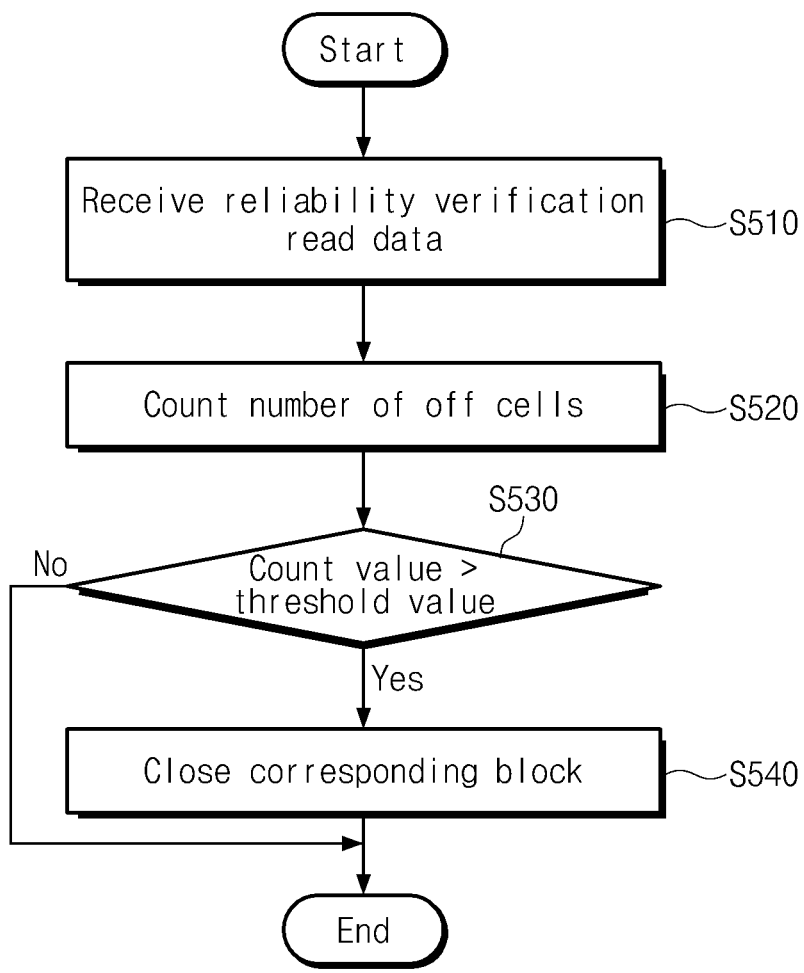
FIG. 17 is a flow chart illustrating another example of a post operation executed after a reliability verification read operation.

FIG. 17 is a flow chart illustrating another example of a post operation executed by the memory controller 1200 after a reliability verification read operation. In FIG. 17, there is illustrated a post process when the reliability verification read operation on an open word line not storing data is performed.

Referring to FIGS. 1 and 17, in operation S510, reliability verification read data may be received. The memory controller 1200 may receive data read from a nonvolatile memory 1300 for reliability verification read.

In operation S520, the number of off cells (or, on cells) may be counted. The off cells may be memory cells which are determined to be turned off at the reliability verification read operation. That is, the off cells may be memory cells, each having a threshold voltage higher than a read voltage used at the reliability verification read operation. The off cells may be memory cells the threshold voltages of which increase from an erase state E due to the disturbance. The on cells may be memory cells which are determined to be turned on at the reliability verification read operation. That is, the on cells may be memory cells each having a threshold voltage lower than a read voltage used at the reliability verification read operation. The count value may be counted by a counter 1230.

In operation S530, whether the count value is larger than a threshold value may be determined. In example embodiments, in step S530, the memory controller 1200 determines if the count value of the number of on cells counted in operation S520, is smaller than a threshold value.

If the count value is not larger than the threshold value, the post operation of the reliability verification read operation may end. If the count value is larger than the threshold value, in operation S540, a corresponding memory block may be closed. For example, a memory block may be closed such that further write operations are not performed with respect to a memory block at which the reliability verification read operation is performed. All open word lines in the memory block that are closed may be invalidated. In a word line storing LSBs and CSBs, a storage space for storing MSBs may be invalidated. In a word line storing LSBs, a storage space for storing CSBs and MSBs may be invalidated. A read operation on a closed memory block may be allowed.

If a memory block is closed, there may be prohibited an operation at which data is written at such a word line (e.g., an open word line) because the probability of error due to cumulative disturbance is high. In an invalidated memory block, cumulative disturbance of a word line storing data may be separately checked through reliability verification read operations on adjacent word lines.

In step S540, instead of closing the memory block, a read reclaim as described above may be performed on the memory block.

FIG. 18A is a table illustrating first examples of a post operation executed after reliability verification read. In FIG. 18A, there are illustrated examples of read reclaim performed by the memory block.

Referring to FIGS. 11A to 11F and 18A, after there is performed a reliability verification read operation on a lower word line WL_k−1 adjacent to a selected word line WL_k, the reliability verification read operation on an upper word line WL_k+1 adjacent to the selected word line WL_k may be performed.

The term "pass" may indicate the case that an execution condition of a post operation is not satisfied at the reliability verification read operation. The term "fail" may indicate the case that an execution condition of a post operation is satisfied at the reliability verification read operation.

In FIG. 18A, there are illustrated a first case that the upper word line WL_k+1 adjacent to the selected word line WL_k is a closed word line and a second case that the upper word line WL_k+1 adjacent to the selected word line WL_k is an open word line.

First of all, the first case that the upper word line WL_k+1 adjacent to the selected word line WL_k is a closed word line will be described.

The reliability verification read operation on the lower word line WL_k−1 may be passed, and the reliability verification read operation on the upper word line WL_k+1 may be passed. At this time, the post operation may not be performed.

The reliability verification read operation on the lower word line WL_k−1 may be passed, and the reliability verification read operation on the upper word line WL_k+1 may be failed. At this time, read reclaim may not be performed.

The reliability verification read operation on the lower word line WL_k−1 may be failed, and the reliability verification read operation on the upper word line WL_k+1 may be passed. At this time, the read reclaim may not be performed.

Below, the second case that the upper word line WL_k+1 adjacent to the selected word line WL_k is an open word line will be described.

The reliability verification read operation on the lower word line WL_k−1 may be passed, and the reliability verification read operation on the upper word line WL_k+1 may be passed. At this time, the post operation may not be performed.

The reliability verification read operation on the lower word line WL_k−1 may be passed, and the reliability verification read operation on the upper word line WL_k+1 may be failed. At this time, a corresponding memory block may be closed.

In the event that the reliability verification read operation on the lower word line WL_k−1 may be failed, the reliability verification read operation on the upper word line WL_k+1 may be skipped. As the reliability verification read operation on the lower word line WL_k−1 is failed, the read reclaim may be performed.

FIG. 18B is a table illustrating second examples of a post operation executed after reliability verification read. In FIG. 18B, there are illustrated examples of read reclaim performed by the page.

Referring to FIGS. 11A to 11F and 18B, after there is performed a reliability verification read operation on a lower word line WL_k−1 adjacent to a selected word line WL_k, the reliability verification read operation on an upper word line WL_k+1 adjacent to the selected word line WL_k may be performed.

In FIG. 18B, there are illustrated a first case that the upper word line WL_k+1 adjacent to the selected word line WL_k is a closed word line and a second case that the upper word line WL_k+1 adjacent to the selected word line WL_k is an open word line.

First of all, the first case that the upper word line WL_k+1 adjacent to the selected word line WL_k is a close word line will be described.

The reliability verification read operation on the lower word line WL_k−1 may be passed, and the reliability verification read operation on the upper word line WL_k+1 may be passed. At this time, the post operation may not be performed.

The reliability verification read operation on the lower word line WL_k−1 may be passed, and the reliability verification read operation on the upper word line WL_k+1 may be failed. At this time, read reclaim may be executed. For example, data stored at memory cells connected with the upper word line WL_k+1 may be read reclaimed.

The reliability verification read operation on the lower word line WL_k−1 may be failed, and the reliability verification read operation on the upper word line WL_k+1 may be passed. As the reliability verification read operation on the lower word line WL_k−1 is failed, the read reclaim may be performed. For example, data stored at memory cells connected with the lower word line WL_k−1 may be read reclaimed.

The reliability verification read operation on the lower word line WL_k−1 may be failed, and the reliability verification read operation on the upper word line WL_k+1 may be failed. As the reliability verification read operations on the lower and upper word lines WL_k−1 and WL_k+1 are failed, the read reclaim may be performed two times. For example, data stored at memory cells connected with the lower word line WL_k−1 may be read reclaimed, and data stored at memory cells connected with the upper word line WL_k+1 may be read reclaimed.

Below, the second case that the upper word line WL_k+1 adjacent to the selected word line WL_k is an open word line will be described.

The reliability verification read operation on the lower word line WL_k−1 may be passed, and the reliability verification read operation on the upper word line WL_k+1 may be passed. At this time, the post operation may not be performed.

The reliability verification read operation on the lower word line WL_k−1 may be passed, and the reliability verification read operation on the upper word line WL_k+1 may be failed. At this time, a corresponding memory block may be closed.

The reliability verification read operation on the lower word line WL_k−1 may be failed, and the reliability verification read operation on the upper word line WL_k+1 may be passed. As the reliability verification read operation on the lower word line WL_k−1 is failed, the read reclaim may be performed. For example, data stored at memory cells connected with the lower word line WL_k−1 may be read reclaimed.

The reliability verification read operation on the lower word line WL_k−1 may be failed, and the reliability verification read operation on the upper word line WL_k+1 may be failed. As the reliability verification read operation on the lower word line WL_k−1 is failed, the read reclaim may be performed. As the reliability verification read operation on the upper word line WL_k+1 is failed, a corresponding memory block may be closed.

Figure 19:
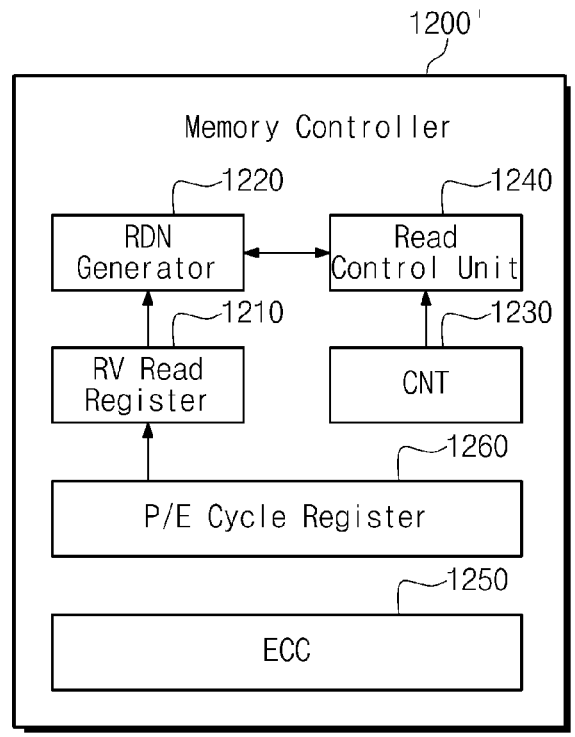
FIG. 19 is a block diagram schematically illustrating a memory controller according to another embodiment of the inventive concepts.

FIG. 19 is a block diagram schematically illustrating a memory controller 1200' according to another embodiment of the inventive concepts. Compared with a memory controller 1200 of FIG. 1, a memory controller 1200' of FIG. 19 may further comprise a program/erase cycle register 1260.

The program/erase cycle register 1260 may store information about program/erase cycles of memory blocks of a nonvolatile memory 1300.

A reliability verification read register 1210 may receive information about program/erase cycles from the program/erase cycle register 1260. The reliability verification read register 1210 may adjust an average value of random numbers generated by a random number generator 1220 according to the information about program/erase cycles. For example, the reliability verification read register 1210 may decrease an average value of random numbers in proportion to an increase in a program/erase cycle.

Figure 20:
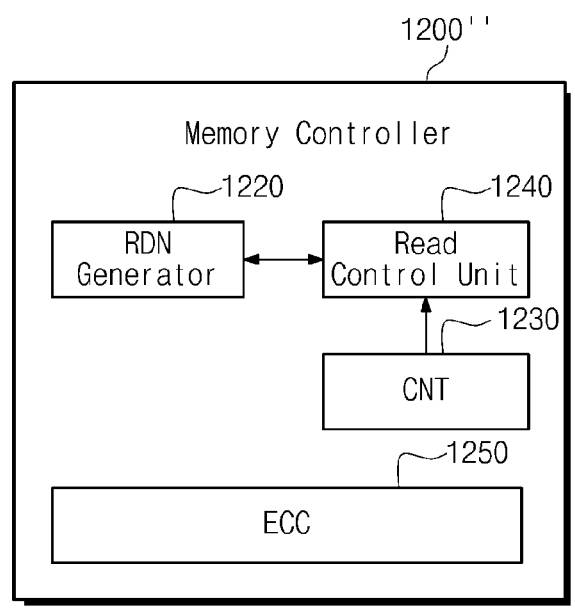
FIG. 20 is a block diagram schematically illustrating a memory controller according still to another embodiment of the inventive concepts.

FIG. 20 is a block diagram schematically illustrating a memory controller 1200" according still to another embodiment of the inventive concepts. Compared with a memory controller 1200 of FIG. 1, a memory controller 1200" of FIG. 20 may not include a random number generator 1220. A read control unit 1240 may perform reliability verification read periodically according to information stored at a reliability verification read register 1210.

Figure 21:
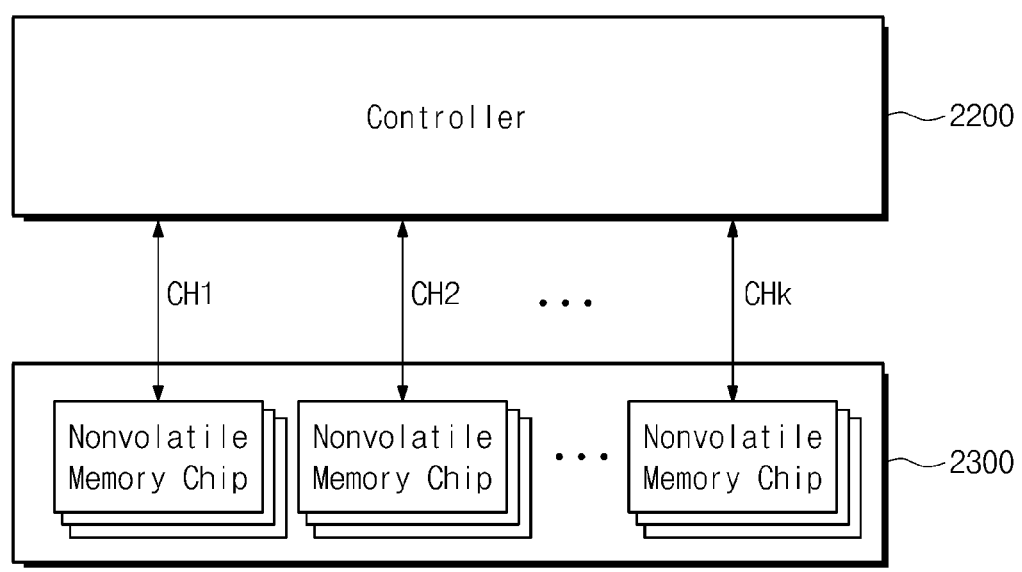
FIG. 21 is a block diagram schematically illustrating an application of a memory system according to an embodiment of the inventive concepts.

FIG. 21 is a block diagram schematically illustrating an application of a memory system according to an embodiment of the inventive concepts. Referring to FIG. 21, a memory system may include a nonvolatile memory 2300 and a memory controller 2200.

The memory controller 2200 may include a memory controller 1200, 1200' or 1200" described with reference to FIG. 1, 19 or 20.

The nonvolatile memory 2300 may include a plurality of nonvolatile memory chips. The nonvolatile memory chips may be divided into a plurality of groups. Nonvolatile memory chips in each group may be configured to communicate with the controller 2200 via a common channel. In FIG. 21, there is illustrated an example in which a plurality of nonvolatile memory chips communicates with the memory controller 2200 via a plurality of channels CH1 to CHk.

Figure 22:
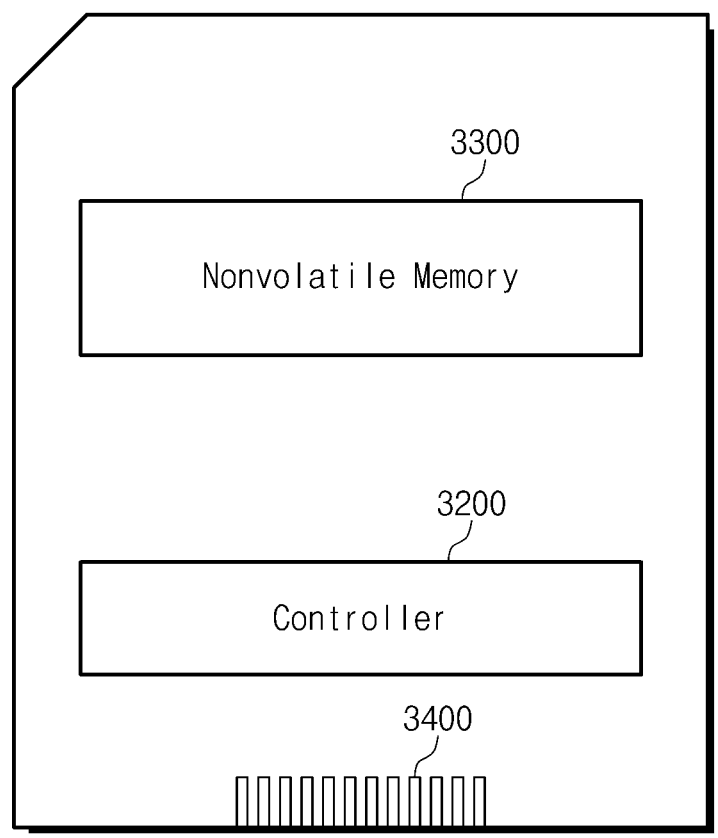
FIG. 22 is a block diagram schematically illustrating a memory card according to an embodiment of the inventive concepts.

FIG. 22 is a block diagram schematically illustrating a memory card according to an embodiment of the inventive concepts. Referring to FIG. 22, a memory card may include a nonvolatile memory 3300, a memory controller 3200, and a connector 3400.

The memory controller 3200 may include a memory controller 1200, 1200' or 1200" described with reference to FIG. 1, 19 or 20.

The memory card may include memory cards such as a PC card (PCMCAI: personal computer memory card international association), a compact flash card (CF), a smart media card (SM, SMC), a memory stick, a multimedia card (MMC, RS-MMC, MMCmicro), an SD card (SD, miniSD, microSD, SDHC), a universal flash storage device (UFS), and so on.

Figure 23:
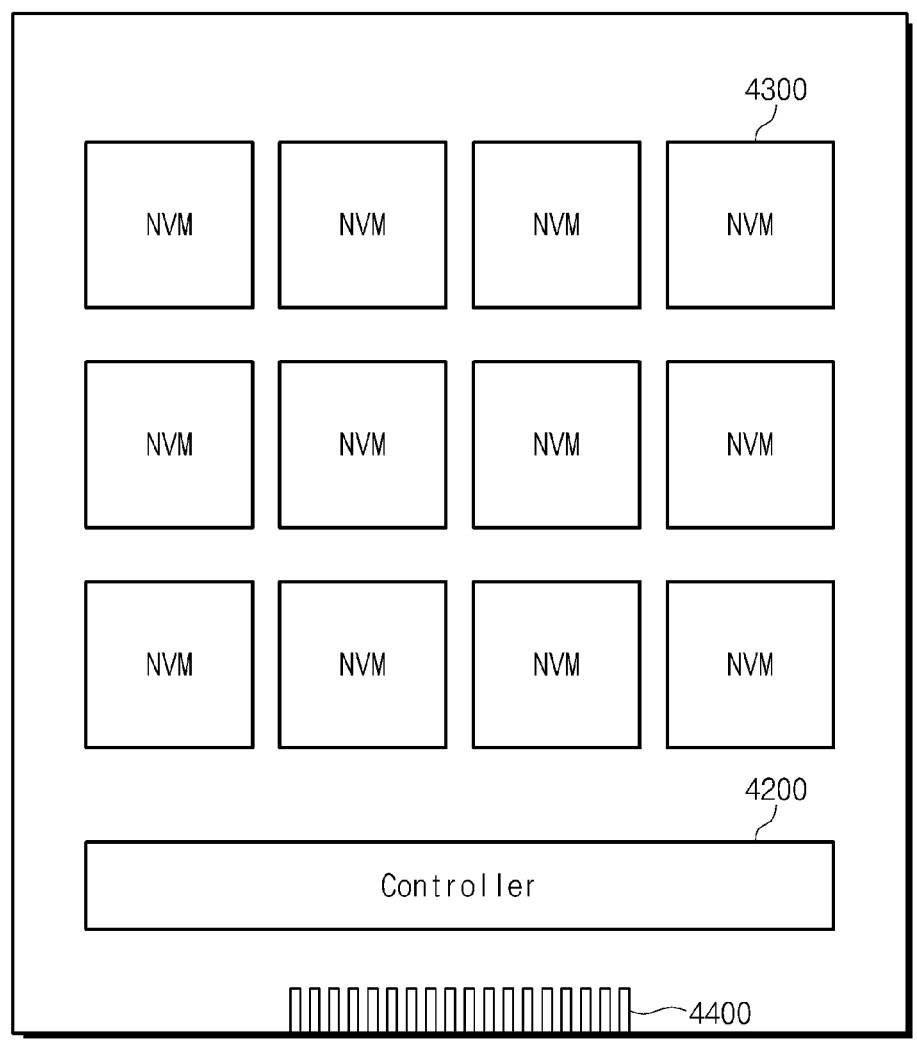
FIG. 23 is a block diagram schematically illustrating a solid state drive according to an embodiment of the inventive concepts.

FIG. 23 is a block diagram schematically illustrating a solid state drive according to an embodiment of the inventive concepts. Referring to FIG. 23, a solid state drive may include a plurality of nonvolatile memories 4300, a memory controller 4200, and a connector 4400.

The memory controller 4200 may include a memory controller 1200, 1200' or 1200" described with reference to FIG. 1, 19 or 20.

While the inventive concepts have been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of operating a memory controller, comprising:
performing a read operation on a memory;
comparing, by the memory controller, a count value with a reference value, the count value being based on a number of read commands issued by the memory controller to the memory;
performing a reliability verification read operation for at least one unselected word line of the memory to verify reliability of the memory when the count value reaches the reference value, the unselected word line being a word line not selected during the read operation; and
performing a read reclaim according to a result of the reliability verification read operation.

2. The method of claim 1, further comprising:
generating a random number as the reference value.

3. The method of claim 2, wherein the generating generates the random number such that an average of random numbers generated over time approaches a desired value.

4. The method of claim 2, wherein the reliability verification read operation is performed if the count value is greater than or equal to the random number.

5. The method of claim 4, further comprising:
resetting the count value if the reliability verification read operation is performed.

6. The method of claim 2, further comprising:
maintaining count values and random numbers for each of a plurality of blocks in the memory; and wherein
the comparing uses the count value and the random number associated with the block to which the read operation is directed.

7. The method of claim 1, wherein the performing the reliability verification read operation performs the reliability verification read operation for the at least one unselected word line adjacent to a selected word line selected during the read operation.

8. The method of claim 1, wherein the unselected word line is an open word line, and each of the at least one memory cell connected to the open word line is in an erased state.

9. The method of claim 1, wherein the performing the reliability verification read operation,
performs the reliability verification read operation for the at least one unselected word line adjacent to a selected word line selected during the read operation, and
perform the reliability verification read operation for at least one open word line if any open word lines exist, and the at least one memory cell connected to the open word line is in an erased state.

10. The method of claim 1, wherein the performing the read reclaim comprises:
determining if the data read during the reliability verification read operation meets a condition; and
performing the read reclaim if the condition is met.

11. The method of claim 10, wherein the condition is if a bit error rate of the data read during the reliability verification read operation is greater than a threshold.

12. The method of claim 1, wherein the read reclaim copies data of a block including the selected word line to a new block and closes the block including a selected word line selected during the read operation.

13. The method of claim 1, further comprises:
performing a control operation if the result of the reliability verification read operation meets a condition, wherein the condition is if a number of off memory cells read during the reliability verification read operation is greater than a threshold.

14. The method of claim 13, wherein the control operation closes the block including a selected word line selected during the read operation.

15. The method of claim 1,
wherein the read reclaim is performed when the result of the reliability verification read operation indicates a low reliability.

16. A memory controller, comprising:
a counter configured to generate a count value based on a number of read commands issued by the memory controller to a memory;
a read controller configured to,
perform a read operation, and
perform a reliability verification read operation for at least one memory cells associated with at least one unselected word line in the memory to verify reliability of the memory when the count value reaches the reference value, wherein
the memory controller is configured to perform a read reclaim according to a result of the reliability verification read operation.

17. The memory controller of claim 16, further comprising:
a first register configured to store a desired value.

18. The memory controller of claim 17, further comprising:
a random number generator configured to generate a random number based on the desired value; and wherein
the read controller is configured to determine whether to perform the reliability verification read operation using the random number as the reference value.

19. The memory controller of claim 17, further comprising:
a second register storing information about program/erase cycles of the memory; and wherein
the memory controller is configured to change the desired value based on the information.

20. The memory controller of claim 16, wherein the counter is configured to rest the count value if the read controller determines to perform the reliability verification read operation.

21. The memory controller of claim 16, wherein
the counter is configured to maintain a respective count value for each of a plurality of blocks in the memory;
a random number generator is configured to maintain a respective random number for each of the plurality of blocks;
the read controller is configured to determine whether to perform the reliability verification read operation based on the respective count value and the respective random number associated with the block to which the read operation is directed, the respective random number serving as the reference value.

22. The memory controller of claim 16, wherein the read controller is configured to perform the reliability verification read operation for the at least one unselected word line adjacent to a selected word line selected during the read operation.

23. The memory controller of claim 16, wherein the unselected word line is an open word line, and each of the at least one memory cell connected to the open word line are in an erased state.

24. The memory controller of claim 16, wherein the read controller is configured to,
perform the reliability verification read operation for the at least one unselected word line adjacent to a selected word line selected during the read operation, and
perform the reliability verification read operation for at least one open word line if any open word lines exist, and the at least one memory cell connected to the open word line is in an erased state.

25. The memory controller of claim 16, wherein the read controller is configured to,
determine if the data read during the reliability verification read operation meets a condition, and
perform the read reclaim if the condition is met.

26. The memory controller of claim 25, wherein the condition is if a bit error rate of the data read during the read verification operation is greater than a threshold.

27. The memory controller of claim 16, wherein the read reclaim copies data of a block including a selected word line selected during the read operation to a new block and closes the block including the selected word line.

28. The memory controller of claim 16, wherein
the read controller is configured to perform a control operation if the result of the reliability verification read operation meets a condition, and
the condition is if a number of off memory cells read during the reliability verification read operation is greater than a threshold.

29. The memory controller of claim 28, wherein the control operation closes the block including a selected word line selected during the read operation.

30. A memory system, comprising:
at least one memory; and
a memory controller configured to,
control the memory,
compare a count value and a reference value, the count value being based on a number of read operations performed by the memory controller on the memory, and
perform a reliability verification read operation for at least one memory cells associated with at least one unselected word line in the memory to verify reliability of the memory when the count value reaches the reference value, wherein
the memory controller is configured to perform a read reclaim according to a result of the reliability verification read operation.

31. The memory system of claim 30, wherein the memory is a non-volatile memory.

32. The memory system of claim 31, wherein the memory includes strings of memory cells, each string including a plurality of memory cells connected in series, and the plurality of memory cells in a string associated with different word lines.

33. The memory system of claim 30, wherein the memory controller is configured to generate a random number as the reference value.

34. The memory system of claim 33, wherein the memory controller is configured to generate the random number such that an average of random numbers generated over time approaches a desired value.

35. The memory system of claim 33, wherein the memory controller is configured to determine to perform the reliability verification read operation if the count value is greater than or equal to the random number.

36. The memory system of claim 35, wherein the memory controller is configured to reset the count value if the the reliability verification read operation is performed.

37. The memory system of claim 33, wherein
the memory controller is configured to maintain count values and random numbers for each of a plurality of blocks in the memory; and
the memory controller is configured to use the count value and the random number associated with the block to which the read operation is directed.

38. The memory system of claim 30, wherein the memory controller is configured to perform the reliability verification read operation for the at least one unselected word line adjacent to a selected word line selected during the read operation.

39. The memory system of claim 30, wherein the unselected word line is an open word line, and each of the at least one memory cell connected to the open word line are in an erased state.

40. The memory system of claim 30, wherein the memory controller is configured to,
perform the reliability verification read operation for the at least one unselected word line adjacent to a selected word line selected during the read operation, and
perform the reliability verification read operation for at least one open word line if any open word lines exist, and the at least one memory cell connected to the open word line are in an erased state.

41. The memory system of claim 30, the memory controller is configured to,
determine if the data read during the reliability verification read operation meets a condition, and
perform the read reclaim if the condition is met.

42. The memory system of claim 41, wherein the condition is if a bit error rate of the data read during the read verification operation is greater than a threshold.

43. The memory system of claim 30, wherein the read reclaim copies data of a block including the selected word line to a new block and closes the block including a selected word line selected during the read operation.

44. The memory system of claim 30, wherein
the memory controller is configured to perform a control operation if the result of the reliability verification read operation meets a condition, and
the condition is if a number of off memory cells read during the reliability verification read operation is greater than a threshold.

45. The memory system of claim 44, wherein the control operation closes the block including the selected word line.

46. A method of operating a nonvolatile memory system, comprising:
performing a read operation on nonvolatile memory cells connected to a selected wordline in a selected block in a nonvolatile memory device;
comparing, by a memory controller, a count value with a reference value, the count value being based on a number of read commands issued by the memory controller to the nonvolatile memory;
performing a reliability verification read operation for the at least one unselected wordline of the nonvolatile memory device when the count value reaches the reference value to verify threshold voltage distributions of the selected block, the unselected wordline being a wordline not selected during the read operation and not programmed after an erase operation; and
closing the selected block according to a result of the reliability verification operation.

47. The method of claim 46, further comprising:
generating a random number as the reference value.

48. The method of claim 47, wherein the generating generates the random number such that an average of random numbers generated over time approaches a desired value.

49. The method of claim 47, wherein the reliability verification read operation is performed if the count value is greater than or equal to the random number.

50. The method of claim 49, further comprising:
resetting the count value if the reliability verification read operation is performed.

51. The method of claim 46, further comprising:
maintaining count values and random numbers for each of a plurality of blocks in the nonvolatile memory device; and wherein
the comparing uses the count value and the random number associated with the selected block.

52. The method of claim 46, wherein the performing the reliability verification read operation performs the reliability verification read operation for the at least one unselected word line adjacent to the selected word line.

53. The method of claim 46, wherein the unselected word line is an open word line, and each of the nonvolatile memory cells connected to the open word line are in an erased state.

54. The method of claim 46, wherein the performing the reliability verification read operation,
performs the reliability verification read operation for the at least one unselected word line adjacent to the selected word line, and
performs the reliability verification read operation for at least one open word line if any open word lines exist, and nonvolatile memory cells connected to the open word line are in an erased state.

55. The method of claim 46, wherein the closing the selected block comprises:
determining if the threshold voltage distribution read during the reliability verification read operation meets a condition; and
closing the selected block if the condition is met.

56. The method of claim 55, wherein the condition is if a bit error rate of the threshold voltage distribution read during the read verification operation is greater than a threshold.

57. The method of claim 46, wherein the closing comprises preventing further program of the at least a portion of the nonvolatile memory device.

58. The method of claim 55, wherein the condition is if a number of off memory cells read during the reliability verification read operation is greater than a threshold.

59. The method of claim 46, wherein the selected block is closed when the result of the reliability verification read operation indicates a low reliability.

60. A method of operating a nonvolatile memory system, comprising:
performing a read operation on nonvolatile memory cells connected to a selected wordline in a selected block in a nonvolatile memory device;
performing a reliability verification read operation to verify reliability of the selected block, the reliability verification read operation being an operation for reading data from at least one of the nonvolatile memory cells with at least one unselected wordline in the selected block, the unselected wordline being a wordline not selected during the read operation; and
performing a post-process for the selected block based on a result of the reliability verification read operation.

61. The method of claim 60, wherein the performing a reliability verification read operation performs the reliability verification read operation for the at least one unselected word line adjacent to the selected word line.

62. The method of claim 60, wherein the unselected word line is an open word line, and each of the nonvolatile memory cells connected to the open word line are in an erased state.

63. The method of claim 60, wherein the performing,
performs the reliability verification read operation for the at least one unselected word line adjacent to the selected word line, and
performs the reliability verification read operation for at least one open word line if any open word lines exist, and the nonvolatile memory cells connected to the open word line are in an erased state.

64. The method of claim 60, wherein the post-process is performed if a bit error rate of the data read during the read verification operation is greater than a threshold.

65. The method of claim 64, wherein the post-process copies data of a block including the selected word line to a new block and closes the block including the selected word line.

66. The method of claim 60, wherein the post-process is performed if a number of off memory cells read during the reliability verification read operation is greater than a threshold.

67. The method of claim 66, wherein the post-process closes the selected block including the selected word line.

* * * * *